(12) United States Patent
Kurjanowicz

(10) Patent No.: US 9,129,687 B2
(45) Date of Patent: Sep. 8, 2015

(54) OTP MEMORY CELL HAVING LOW CURRENT LEAKAGE

(75) Inventor: Wlodek Kurjanowicz, Arnprior (CA)

(73) Assignee: Sidense Corp., Ottawa, Ontario (CA)

( * ) Notice: Subject to any disclaimer, the term of this patent is extended or adjusted under 35 U.S.C. 154(b) by 0 days.

(21) Appl. No.: 13/504,295

(22) PCT Filed: Oct. 29, 2010

(86) PCT No.: PCT/CA2010/001700

§ 371 (c)(1),
(2), (4) Date: Apr. 26, 2012

(87) PCT Pub. No.: WO2011/050464

PCT Pub. Date: May 5, 2011

(65) Prior Publication Data

US 2012/0211841 A1    Aug. 23, 2012

Related U.S. Application Data

(60) Provisional application No. 61/256,608, filed on Oct. 30, 2009.

(51) Int. Cl.
*G11C 17/16* (2006.01)
*H01L 27/112* (2006.01)

(52) U.S. Cl.
CPC .............. *G11C 17/16* (2013.01); *H01L 27/112* (2013.01); *H01L 27/11206* (2013.01)

(58) Field of Classification Search
CPC ............ H01L 27/112; H01L 27/11206; H01L 27/115; H01L 27/45; H01L 27/141; H01L 23/5252; H01L 29/42384; H01L 29/42368; H01L 29/7831; G11C 17/16

USPC .................... 257/50, 288, 368, 530, E23.147; 438/131, 197; 365/96
See application file for complete search history.

(56) References Cited

U.S. PATENT DOCUMENTS 5,646,438 A * 7/1997 Frerichs ......................... 257/530
5,742,555 A * 4/1998 Marr et al. ................. 365/225.7

(Continued)

FOREIGN PATENT DOCUMENTS

CN    101488502 A    7/2009
WO    2009121182 A1    10/2009

OTHER PUBLICATIONS

Plummer, Silicon VLSI Technology, 2000, Prentice Hall, p. 60.*

(Continued)

*Primary Examiner* — Tucker Wright
(74) *Attorney, Agent, or Firm* — Shin Hung; Borden Ladner Gervais LLP

(57) ABSTRACT

A one time programmable memory cell having twin wells to improve dielectric breakdown while minimizing current leakage. The memory cell is manufactured using a standard CMOS process used for core and I/O (input/output) circuitry. A two transistor memory cell having an access transistor and an anti-fuse device, or a single transistor memory cell 100 having a dual thickness gate oxide 114 & 116, are formed in twin wells 102 & 104. The twin wells are opposite in type to each other, where one can be an N-type well 102 while the other can be a P-type well 104. The anti-fuse device is formed with a thin gate oxide and in a well similar to that used for the core circuitry. The access transistor is formed with a thick gate oxide and in a well similar to that used for I/O circuitry.

20 Claims, 20 Drawing Sheets

(56) References Cited

U.S. PATENT DOCUMENTS

| | | |
|---|---|---|
| 6,667,902 B2 | 12/2003 | Peng |
| 6,671,040 B2 | 12/2003 | Fong et al. |
| 7,402,855 B2 | 7/2008 | Kurjanowicz |
| 2001/0026494 A1* | 10/2001 | Marr et al. .................. 365/225.7 |
| 2006/0292754 A1* | 12/2006 | Min et al. ...................... 438/131 |
| 2007/0076463 A1 | 4/2007 | Keshavarzi et al. |
| 2007/0257331 A1 | 11/2007 | Kurjanowicz et al. |

OTHER PUBLICATIONS

Chinese Patent Application No. 201080049218.6, English Translated Office Action dated Jun. 9, 2014.

Chinese Patent Application No. 201080049218.6 English Translation of Office Action dated Feb. 27, 2015.

\* cited by examiner

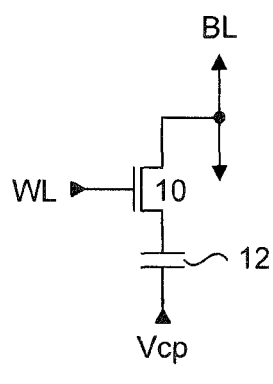
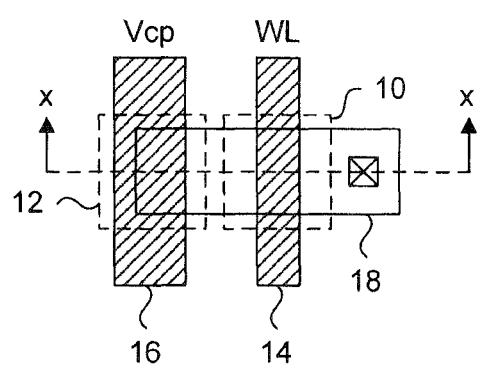
FIG. 1 (Prior Art)　　　　FIG. 2 (Prior Art)
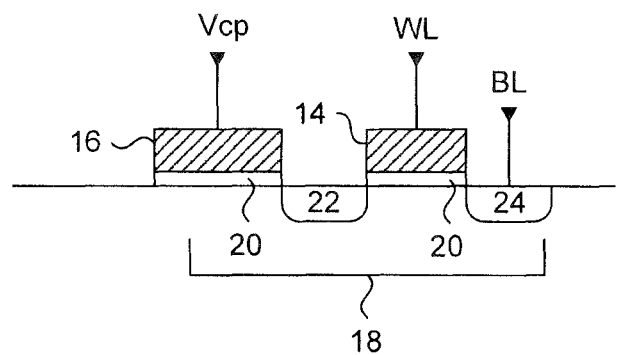
FIG. 3 (Prior Art)

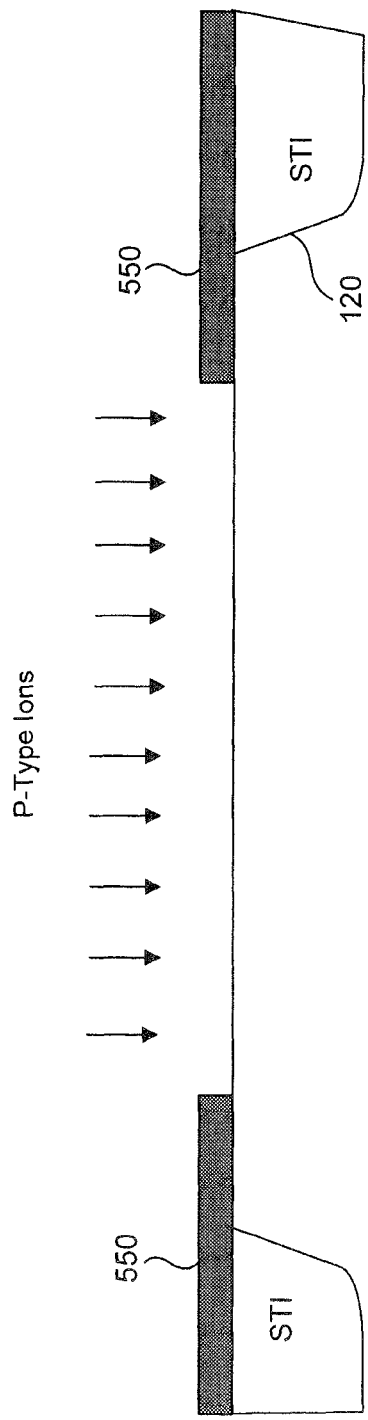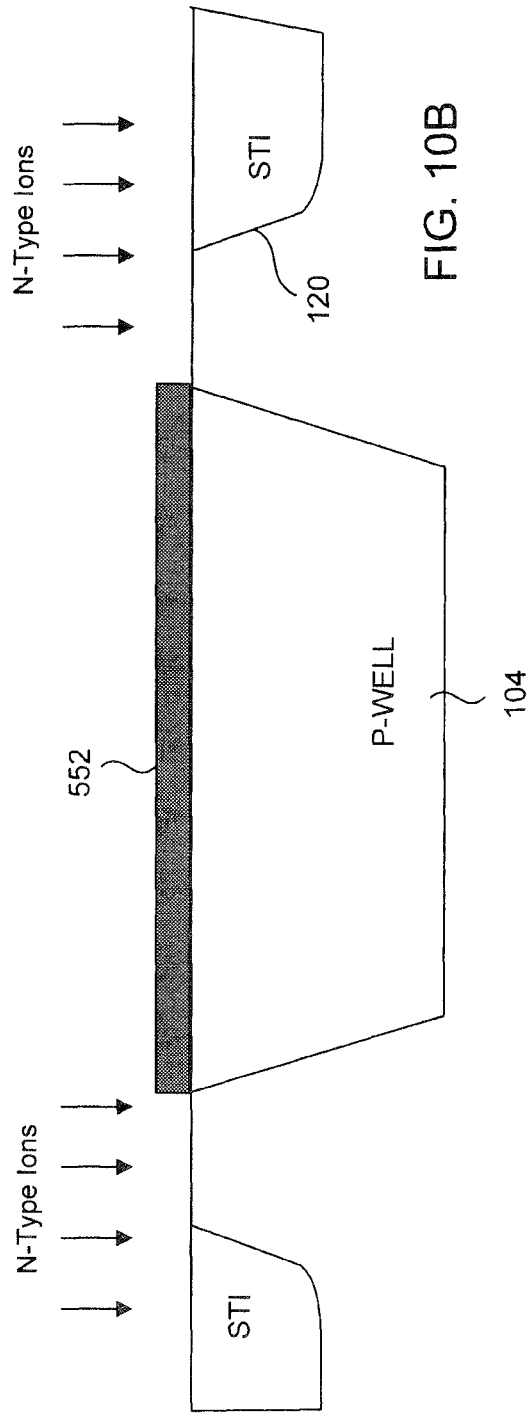

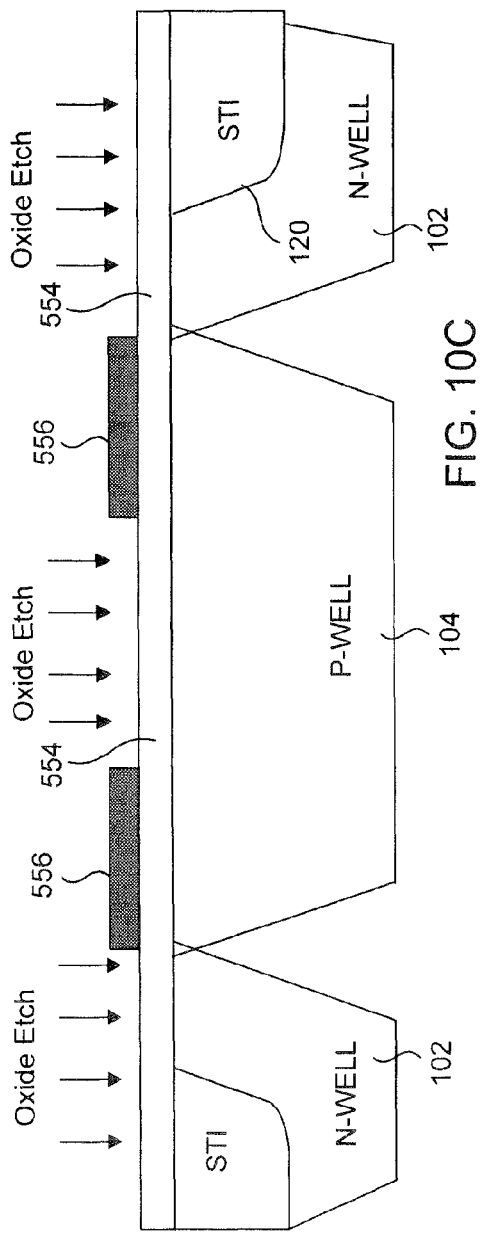
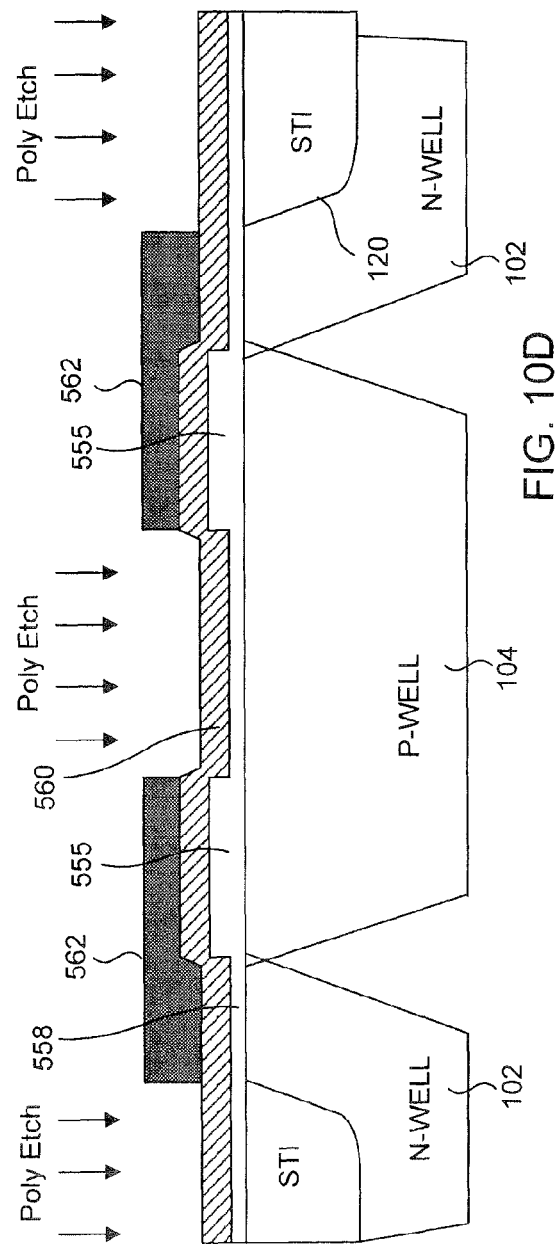
FIG. 10C
FIG. 10D

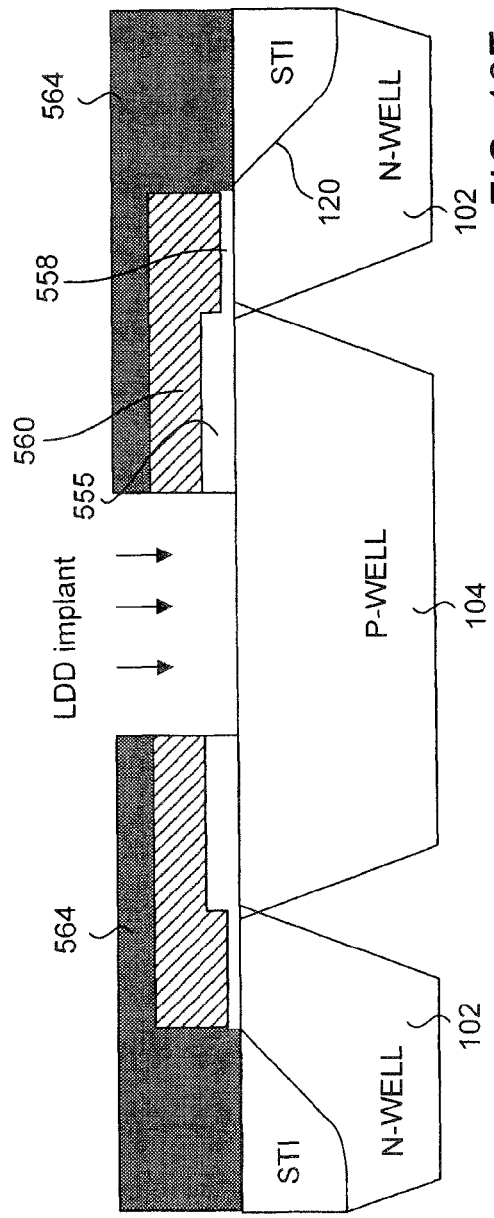
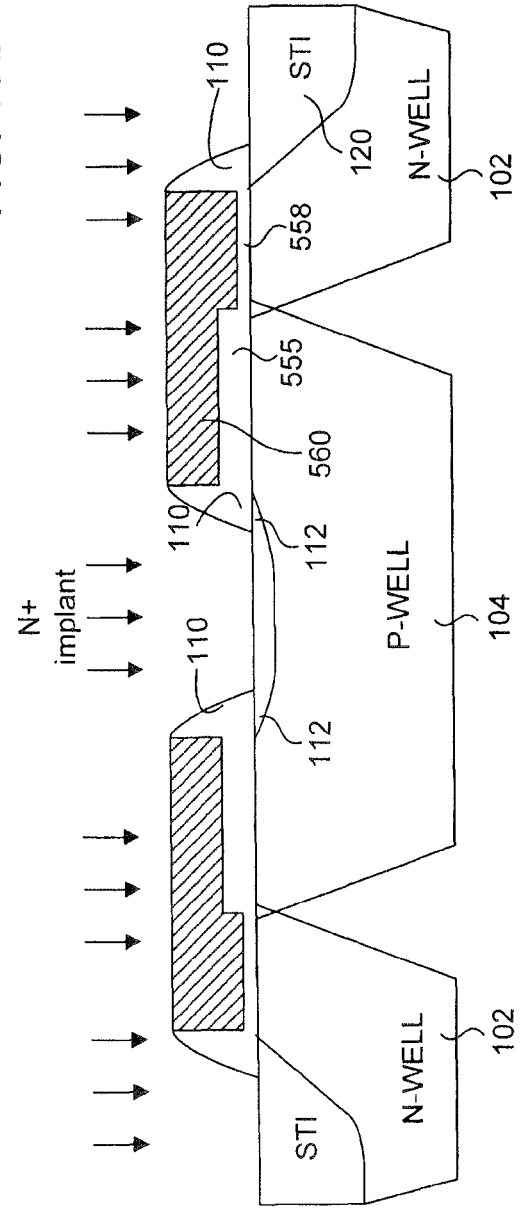

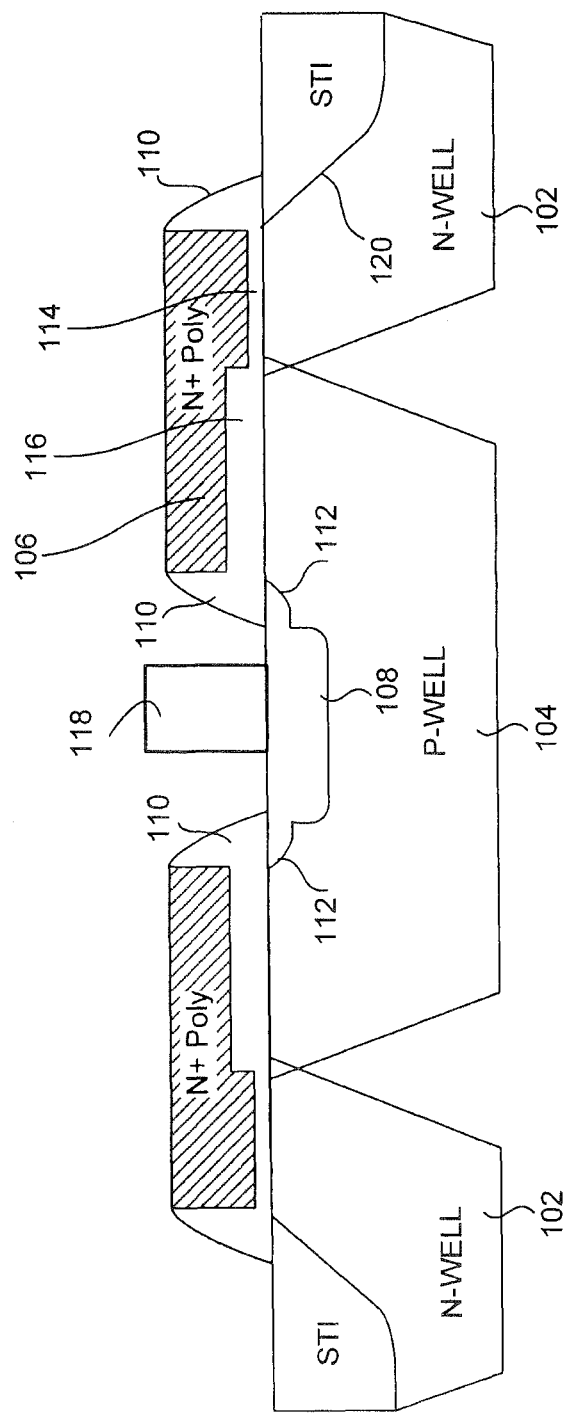

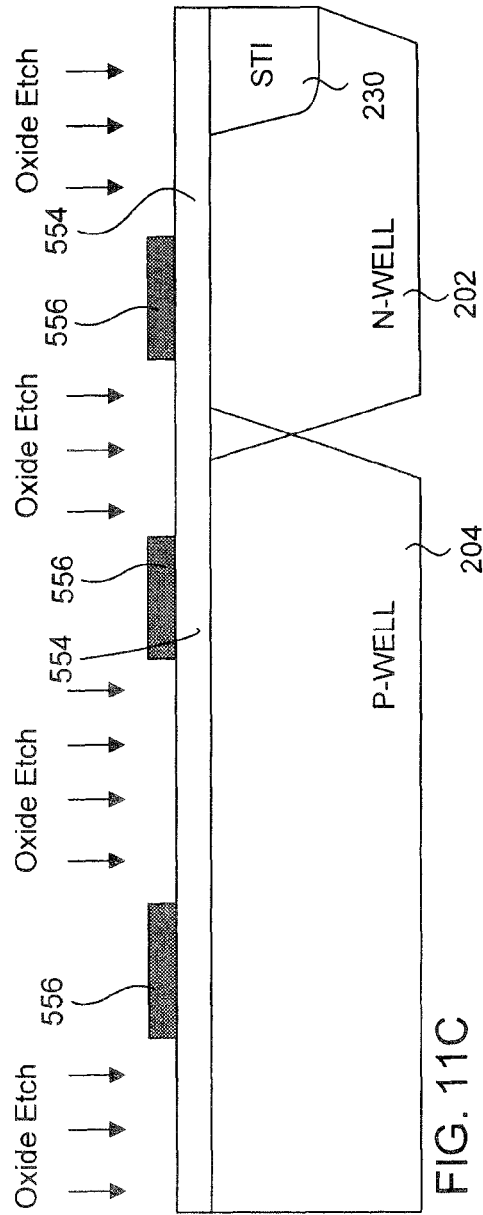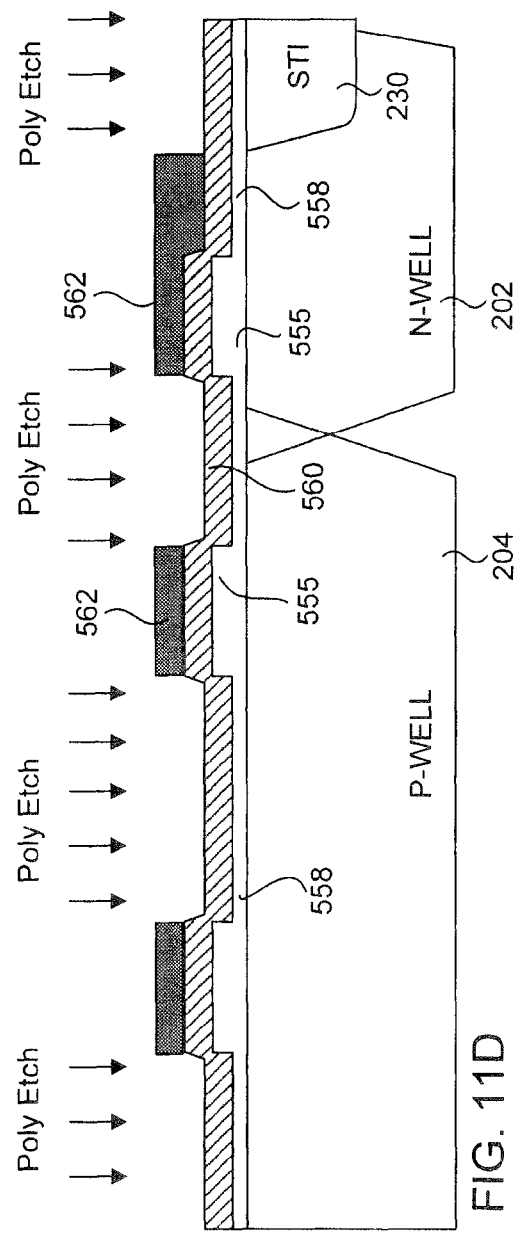

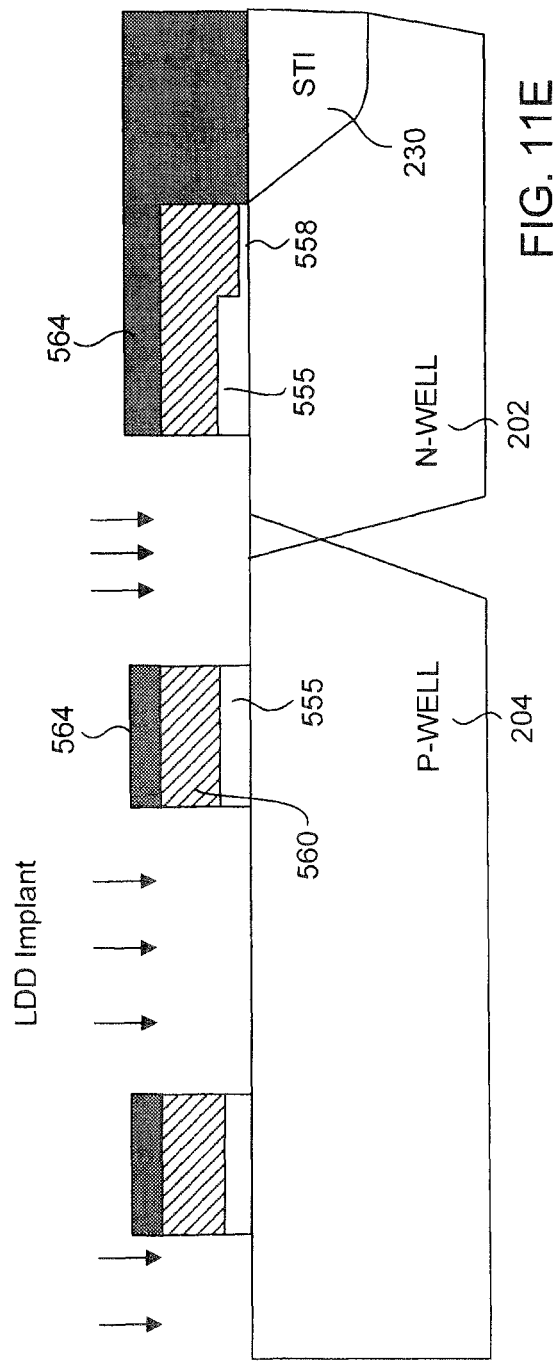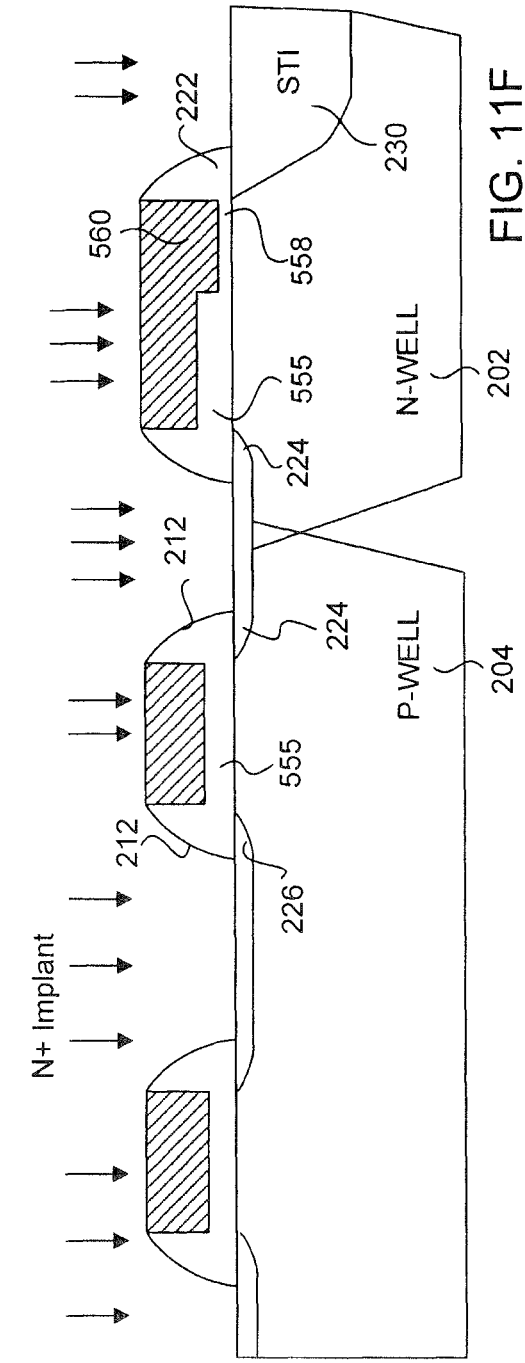

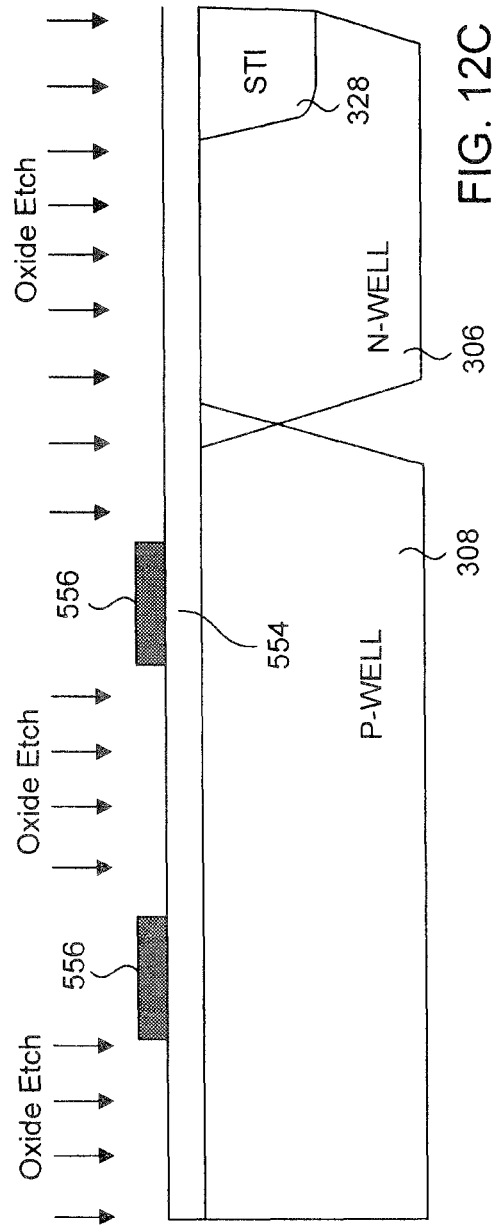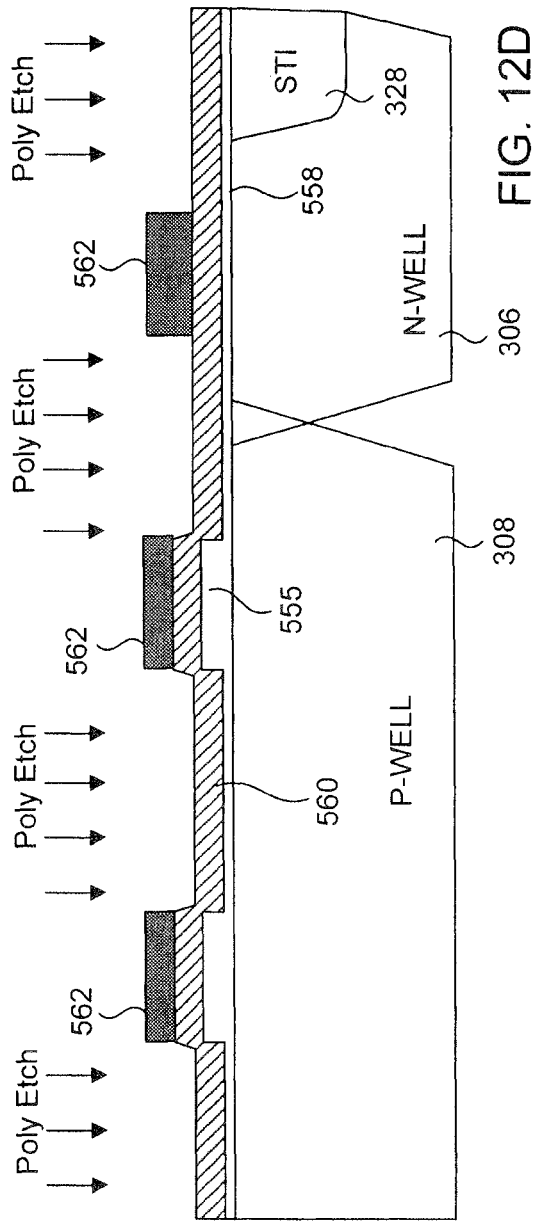

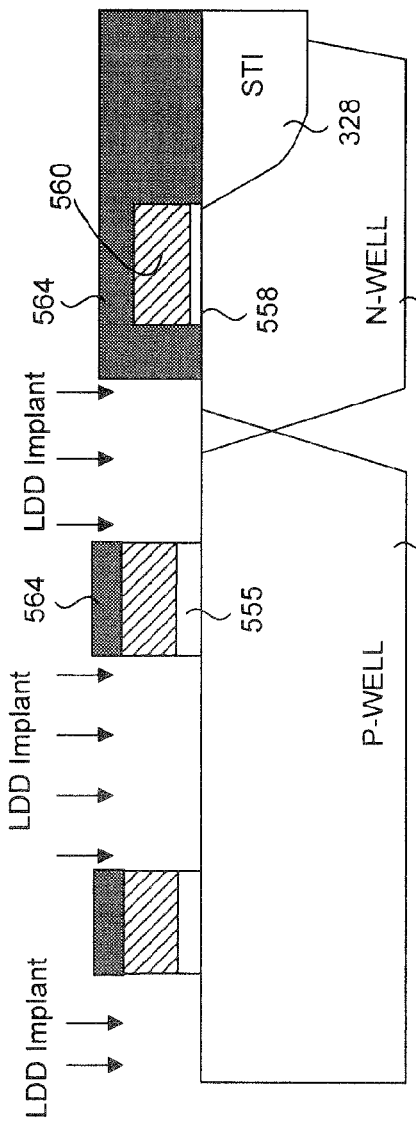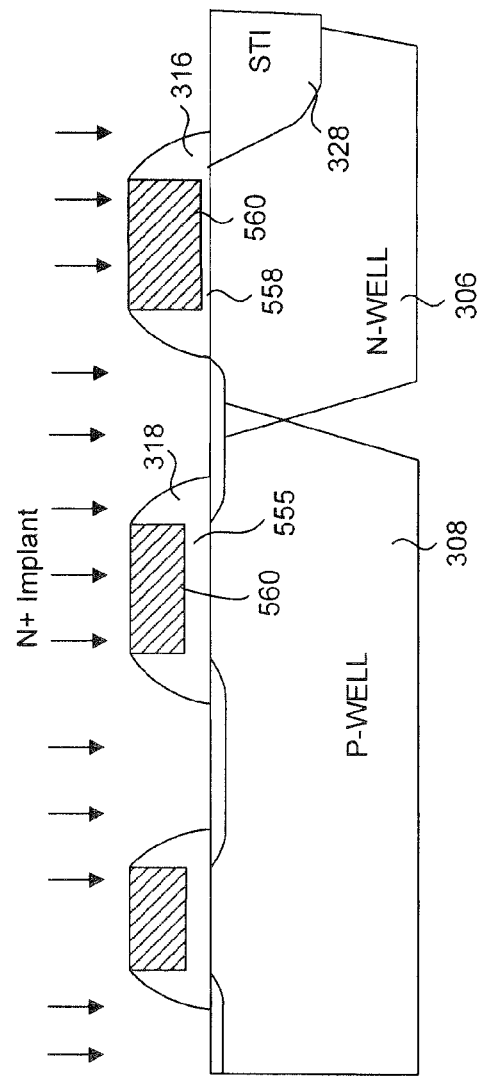

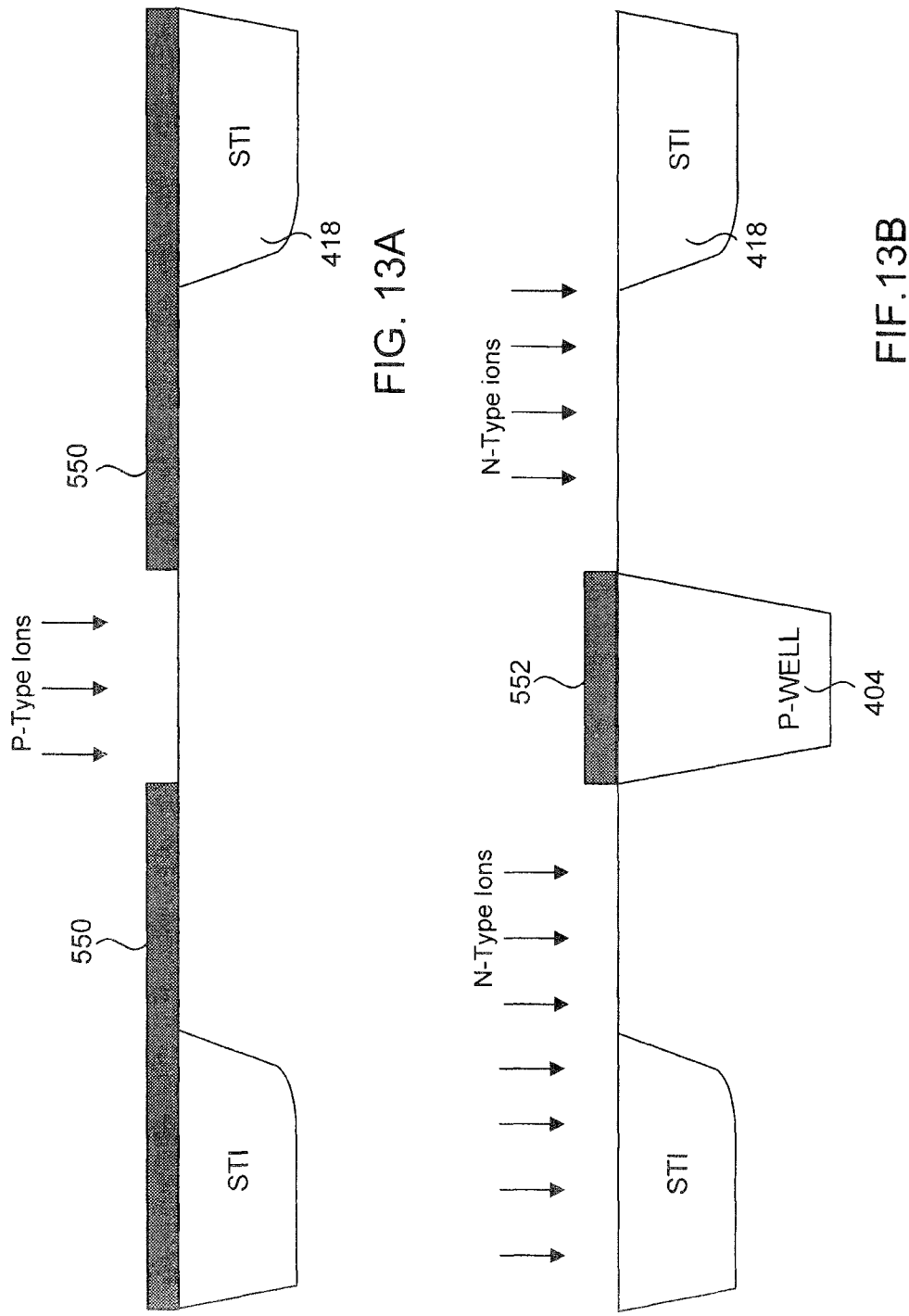

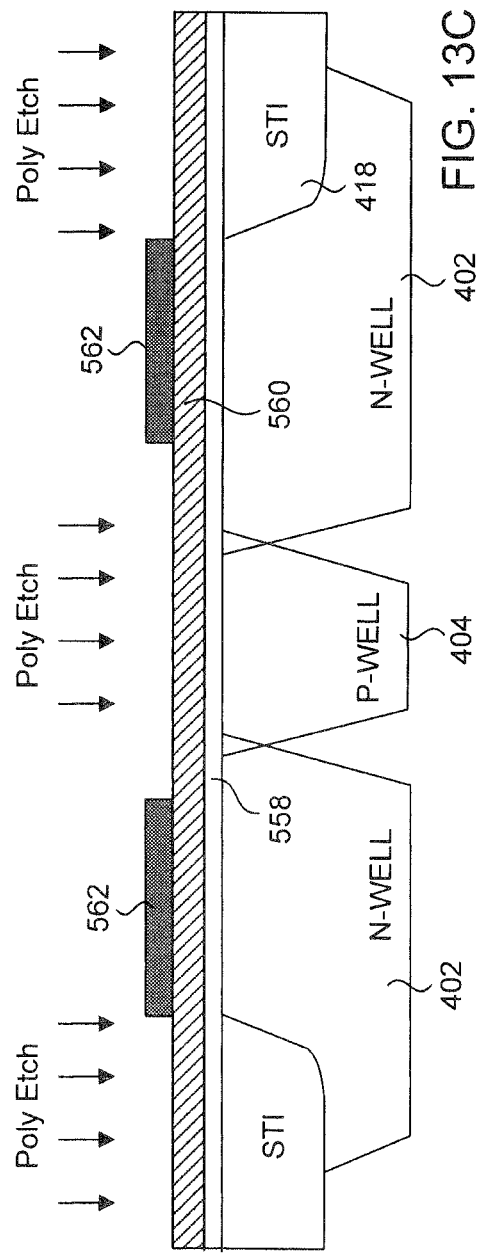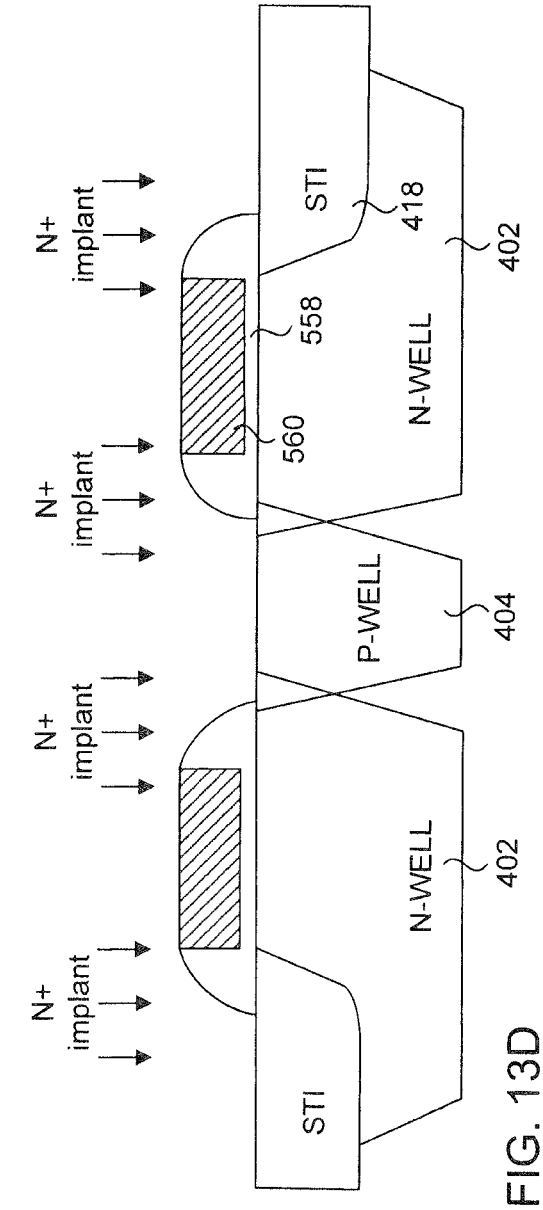

US 9,129,687 B2

OTP MEMORY CELL HAVING LOW CURRENT LEAKAGE

CROSS REFERENCE TO RELATED APPLICATIONS

This application is a National Phase Entry of International Patent Application No. PCT/CA2010/001700, filed on Oct. 29, 2010, which claims the benefit of priority of U.S. Provisional Patent Application No. 61/256,608, filed on Oct. 30, 2009, the contents of which are incorporated herein by reference in their entirety.

FIELD OF THE INVENTION

The present invention relates generally to non-volatile memory. More particularly, the present invention relates to anti-fuse devices.

BACKGROUND OF THE INVENTION

In the following description the term MOS is used to denote any FET or MIS transistor, half-transistor or capacitor structure. In order to simplify the description of the embodiments, references to gate oxides from this point forward should be understood to include dielectric materials, oxide, or a combination of oxide and dielectric materials.

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. Anti-fuse devices can be arranged into a memory array, thereby forming what is commonly known as a one-time-programmable (OTP) memory.

Current anti-fuse development is concentrated around 3-dimensional thin film structures and special inter-metal materials. Such anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

One type of anti-fuse memory cell manufacturable with a standard CMOS process is disclosed in U.S. Pat. No. 6,667,902 (Peng). Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng further improves his array in U.S. Pat. No. 6,671,040 by adding a variable voltage controlling programming current, which allegedly controls the degree of gate oxide breakdown, allowing for multilevel or analog storage applications.

FIG. 1 is a circuit diagram of an anti-fuse memory cell disclosed in Peng, while FIGS. 2 and 3 show simplified planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse devices. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

The gate dielectric breakdown based anti-fuse devices are gaining popularity as a preferred OTP or emulated multiple time programmable (MTP) non-volatile memory devices in the industry. Such anti-fuse devices used either in a memory array or as an individual programmable cell consists of at least two regions. First is a high voltage breakdown region and second is a low voltage breakdown region (or anti-fuse region).

FIG. 4 is a cross sectional diagram of an improved version of the anti-fuse memory cell shown in FIG. 1. Just like the anti-fuse memory cell of FIG. 1, FIG. 4 shows a two-transistor anti-fuse memory cell 30, which consists of an access transistor in series with an anti-fuse device. The access transistor, or access device, includes a polysilicon gate 32 overlying a thick gate oxide 34, which itself is formed over the channel 36. On the left side of the channel 36 is a diffusion region 38 electrically connected to a bitline contact 40. On the right side of the channel 36 is a common diffusion region 42 shared with the anti-fuse device. The anti-fuse device includes a polysilicon gate 44 overlying a thin gate oxide 46, which itself is formed over the channel 48. The thick gate oxide 34 can correspond to that used for high voltage transistors while the thin gate oxide 46 can correspond to that used for low voltage transistors. Polysilicon gates 32 and 44 can be independently controlled, or alternatively can be connected to each other. For example, polysilicon gate 32 can be coupled to a wordline while polysilicon gate 44 can be coupled to a controlled cell plate voltage (VCP). Both diffusion regions 38 and 42 can have LDD regions, which can be identically doped or differently doped, depending on the desired operating voltages to be used. Thick field oxide, or shallow trench isolation (STI) oxide 54 and 56 are formed for isolating the memory cell from other memory cells and/or core circuitry transistors. Commonly owned U.S. 2007/0257331 filed on Jun. 13, 2007 describes alternate two-transistor anti-fuse memory cells which can be used in a non-volatile memory array. The thin gate oxide 46 is intended to breakdown in the presence of a large electrical field during a programming operation, thereby creating an electrically conductive connection between channel 48 and polysilicon gate 44. This electrically conductive connection can be referred to as a conductive link or anti-fuse.

Such an anti-fuse device implemented in a standard CMOS process utilizes high voltage (HV) or input/output (I/O) transistors and low voltage (LV) or core transistors to implement the thick dielectric and thin dielectric regions respectively. The fabrication of HV and LV transistors includes the process steps such as well formation and threshold voltage (Vt) adjustment implants. Those skilled in the art will understand that HV transistors are typically used in the I/O circuits such as input and output buffers, or in the circuitry that requires lower leakage and/or higher operating voltage comparing to the core area, where the LV transistors can be used. LV transistors on the other hand are typically used for core circuit transistors, or for circuitry that requires high speed switching performance for example. Accordingly, the electrical characteristics of HV and LV transistors are different since they are designed for specific applications. In the two-transistor anti-fuse memory cell 30, it is desirable to minimize the Vt of the anti-fuse device consisting of polysilicon gate 44. Therefore it is formed using an LV transistor process. As shown in FIG. 4 by example, the anti-fuse device consisting of polysilicon gate 44 is formed in a low voltage p-type well (PWELL-LV) 50 that has a dopant concentration, a Vt implant and gate oxide thickness specifically set for an LV transistor. The access device consisting of polysilicon gate 32 is formed in a high voltage p-type well (PWELL-HV) 52 that has a dopant concentration, a Vt implant and a gate oxide thickness specifically set for an HV transistor. Therefore the Vt of the anti-fuse device will be the same as the Vt of a core circuit transistor.

A driving factor for reducing cost of any memory is the memory array area. The two-transistor anti-fuse memory cell 30 of FIG. 4 is a relatively large memory cell when compared to single transistor memory cells, such as flash memory cells for example. A single transistor anti-fuse memory cell is described in commonly owned U.S. Pat. No. 7,402,855.

FIG. 5 is a cross-sectional view of the single transistor anti-fuse memory cell disclosed in commonly owned U.S. Pat. No. 7,402,85 5. Anti-fuse device 60 includes a variable thickness gate oxide 62 formed on the substrate channel region 64, a polysilicon gate 66, sidewall spacers 68, a field oxide region 70 a diffusion region 72, and an LDD region 74 in the diffusion region 72. A bitline contact 76 is shown to be in electrical contact with diffusion region 72. The variable thickness gate oxide 62 consists of a thick gate oxide and a thin gate oxide such that a portion of the channel length is covered by the thick gate oxide and the remaining portion of the channel length is covered by the thin gate oxide. From this point forward, the thin gate oxide portion corresponds to the anti-fuse device portion of the single transistor anti-fuse memory cell while the thick gate oxide portion corresponds to the access transistor or device portion of the single transistor anti-fuse memory cell. Generally, the thin gate oxide is a region where oxide breakdown can occur. The thick gate oxide edge meeting diffusion region 72 on the other hand, defines an access edge where gate oxide breakdown is prevented and current between the gate 66 and diffusion region 72 is to flow for a programmed anti-fuse device. While the distance that the thick oxide portion extends into the channel region depends on the mask grade, the thick oxide portion is preferably formed to be at least as long as the minimum length of a high voltage transistor formed on the same chip.

In the presently shown example, the diffusion region 72 is connected to a bitline through a bitline contact 76, or other line for sensing a current from the polysilicon gate 66, and can be doped to accommodate programming voltages or currents. This diffusion region 72 is formed proximate to the thick oxide portion of the variable thickness gate oxide 62. To further protect the edge of anti-fuse device 60 from high voltage damage, or current leakage, a resistor protection oxide (RPO), also known as a salicide protect oxide, can be introduced during the fabrication process to further space metal particles from the edge of sidewall spacer 68. This RPO is preferably used during the salicidation process for preventing only a portion of diffusion region 72 and a portion of polysilicon gate 66 from being salicided. It is well known that salicided transistors are known to have higher leakage and therefore lower breakdown voltage. Thus having a non-salicided diffusion region 72 will reduce leakage. Diffusion region 72 can be doped for low voltage transistors or high voltage transistors or a combination of the two resulting in same or different diffusion profiles.

Once again, it is desirable to minimize the Vt of the anti-fuse device defined by the portion of the polysilicon gate 66 over the thin gate oxide portion of the variable thickness gate oxide 62. Therefore it is formed using an LV transistor process. As shown in FIG. 5 by example, the anti-fuse device consisting of polysilicon gate 66 over the thin gate oxide portion is formed in a low voltage p-type well PWELL-LV 78 that has a dopant concentration, a Vt implant and gate oxide thickness specifically set for an LV transistor. The access gate consisting of polysilicon gate 66 over the thick gate oxide portion of the variable thickness gate oxide 62 is formed in a high voltage p-type well PWELL-HV 80 that has a dopant concentration, a Vt implant and a gate oxide thickness specifically set for an HV transistor. Therefore the Vt of the anti-fuse device will be the same as the Vt of a core circuit transistor.

Unfortunately, foundries for manufacturing semiconductor devices may have set types of LV transistor processes for manufacturing core circuits of the memory device, where the Vt control implant differs depending on the circuit application or function. Semiconductor memory devices generally have three circuit areas. First are the I/O circuits that are connected to pins of the package of the semiconductor memory device. Second are the core circuits, which include any logic and control circuits for example. Third is the memory array, which includes memory cells. Compounding this problem is the fact that the anti-fuse is typically designed on the basis of a particular LV transistor process, which means that the anti-fuse device has been qualified to operate properly if manufactured according to that particular LV transistor process. If the foundry does not have an LV transistor process suited for the design, then redesign of the anti-fuse device is required in order to qualify it for the available process. Such redesign incurs significant cost overhead, which is necessitated again when the foundry introduces a new generation of the process to accommodate a new manufacturing technology node. For example, an LV process for a 45 nm technology node may be different than that of a 20 nm technology node.

Another important issue is reliability of the anti-fuse memory device, and more specifically the quality of the thin gate oxide. The thin gate oxide quality is affected by the condition of the underlying channel surface, the concentration and uniformity of dopants at the channel surface, and implantation damage, just to name a few factors. Generally, the more process steps that the anti-fuse device is subjected to, the higher the probability for producing a defective anti-fuse device. Since anti-fuse based memory devices are programmed after manufacture by end-users, it is difficult to test for the reliability of an anti-fuse device before programming. Therefore the quality of the thin gate oxide should be maximized, since an inadvertently programmed anti-fuse device or an unprogrammable anti-fuse device will likely cause failure in the system. In the automotive industry, such a failure can have catastrophic consequences.

As device features continue to decrease in size, minimization of leakage current becomes even more important. FIGS. 4 and 5 are examples of typical OTP cells fabricated on wells of similar type. Although they are improvements over earlier structures, the fabrication process still has it challenges. The use of Vt adjust implants are required to address minimization of leakage currents. However, Vt adjust implants increase the number of process steps the memory cell is exposed to. This increase in the number of process steps exposes the memory cells to a higher probability of reliability issues. These structures also exhibit sensitivities to mask alignment issues where it would affect the functionality or reliability of the device. Finally, the differences of Vt processes between the different foundries and process nodes pose problems requiring memory cell redesigns.

The ability to control the dielectric breakdown during the programming of one time programmable (OTP) memory cells to minimize leakage current becomes more and more important as process nodes continue to decrease, as well as the need for second sourcing. Concerns of reliability, circuit density, cost and ease of manufacture will remain areas of importance. Therefore, it is highly desirable to provide an anti-fused based memory cell where; leakage current is minimized through a controlled and predictable dielectric breakdown, fabrication is done with standard processing with minimal addition of process steps, minimal sensitivity to mask alignment issues, as well as, process migration is simplified with no redesigns required. All contributing to an overall result of higher product quality and reduced costs of manufacturing.

SUMMARY OF THE INVENTION

It is an object of the present invention to obviate or mitigate at least one disadvantage of previous anti-fuse memory devices.

In a first aspect, there is provided a memory device. The memory device includes a first well, a second well, an anti-fuse device and an access device. The first well can be of a first type and the second well can be of a second type. The anti-fuse device can be formed over the second well with a first polysilicon gate doped to be the second type, and the access device can be formed over the first well with a second polysilicon gate for electrically coupling the anti-fuse device to a bitline contact.

In a present embodiment of the first aspect, the anti-fuse device has a first gate oxide and the access device has a second gate oxide, where the second gate oxide is thicker than the first gate oxide. In this present embodiment, a core transistor device can be formed in a third well identical to the second well, and the core transistor can have a gate oxide substantially identical in thickness to the first gate oxide. Alternately, an input/output transistor device can be formed in a third well identical to the first well, and the input/output transistor device can have a gate oxide substantially identical in thickness to the second gate oxide.

According to an alternate embodiment, the anti-fuse device and the access device can be formed together as a split-channel anti-fuse memory cell having a variable thickness gate oxide. Alternately, the access device can be electrically coupled to the anti-fuse device through a diffusion region, where the diffusion region can include a lightly doped drain (LDD) region extending towards the first polysilicon gate and the second polysilicon gate.

In yet another alternate embodiment, the anti-fuse device can include a split-channel anti-fuse memory cell having a variable thickness gate oxide formed on the second well. The split-channel anti-fuse memory cell can include an access device portion and an anti-fuse device portion. The access device portion can have a third gate oxide, the third gate oxide being thicker than the first gate oxide. The second gate oxide and the third gate oxide can have substantially the same thickness.

In another embodiment, the first gate oxide of the anti-fuse device can have a uniform thickness underneath an entire length dimension of the first polysilicon gate. The diffusion region can include a lightly doped drain (LDD) region extending towards the second polysilicon gate, while omitting an LDD region extending towards the first polysilicon gate. Furthermore, the anti-fuse device can include a first sidewall spacer formed adjacent to the first polysilicon gate, and the access device can include a second sidewall spacer formed adjacent to the second polysilicon gate, where the first sidewall spacer is thicker than the second sidewall spacer.

In a second aspect, there is provided a memory array. The memory array includes anti-fuse devices and access devices. The anti-fuse devices are formed in wells of a first type while the access devices are formed in wells of a second type opposite to the first type for electrically coupling the anti-fuse devices to corresponding bitlines. In the present aspect, the anti-fuse devices can include polysilicon gates doped to be the first type. According to a present embodiment of the second aspect, each of the anti-fuse devices and the access devices are formed as a single transistor anti-fuse memory cell having a variable thickness gate oxide, where the anti-fuse device has a first gate oxide thickness and the access device has a second gate oxide thickness greater than the first gate oxide thickness.

Other aspects and features of the present invention will become apparent to those ordinarily skilled in the art upon review of the following description of specific embodiments of the invention in conjunction with the accompanying drawings.

BRIEF DESCRIPTION OF THE DRAWINGS

Embodiments of the present invention will now be described, by way of example only, with reference to the attached drawings, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line x-x;

FIGS. 10A to 10G illustrate CMOS process steps used to form the single transistor twin well anti-fuse memory cell of FIG. 6;

FIGS. 11A to 11G illustrate CMOS process steps used to form the two transistor twin well anti-fuse memory cell of FIG. 7;

FIGS. 12A to 12G illustrate CMOS process steps used to form the two-transistor twin well anti-fuse memory cell without LDD region of FIG. 8;

FIGS. 13A to 13E illustrate CMOS process steps used to form the single transistor anti-fuse memory cell without LDD region of FIG. 9; and, FIG. 14 is a cross-sectional view of a memory device, according to a present embodiment.

DETAILED DESCRIPTION

The embodiments of the present invention address the need for improved control of the dielectric breakdown of the anti-fuse device of OTP memory cells during the programming of the OTP cells, while minimizing current leakage. According to the present embodiments, this is achieved by fabricating the access transistor and anti-fuse device over wells of different or opposite type. Referred to as a twin well anti-fuse memory cell from this point forward, the present embodiments describe both single transistor 1T and two-transistor 2T memory cells using standard CMOS device processing without the need for added processing steps, since the structures of the twin well anti-fuse memory cells can be fabricated at the same time as the other transistor devices outside of the memory array are formed.

In particular, the twin well anti-fuse memory cells of the present embodiments comprise of a first well of a first type, a second well of the second type, an anti-fuse device formed over the second well with a polysilicon gate doped with the second type, and an access device formed over the first well with a polysilicon gate doped with the second type for electrically coupling the bitline contact to the anti-fuse device. According to the present embodiments, a thin gate oxide similar to that used for the core circuitry, is used for the anti-fuse device, while a thick gate oxide similar to that used for the I/O circuitry, is used for the access transistor. Similarly, the first well and the second well can be the same type used for I/O circuitry and core circuitry.

The wells used in the present embodiments can be formed as either low voltage (LV) or high voltage (HV) wells. Low voltage wells can be used for core logic circuits of the semiconductor device which operate at high speed, while the high voltage wells can be used for input/output (I/O) circuitry process requiring lower leakage and higher operating voltages.

Figure 5:
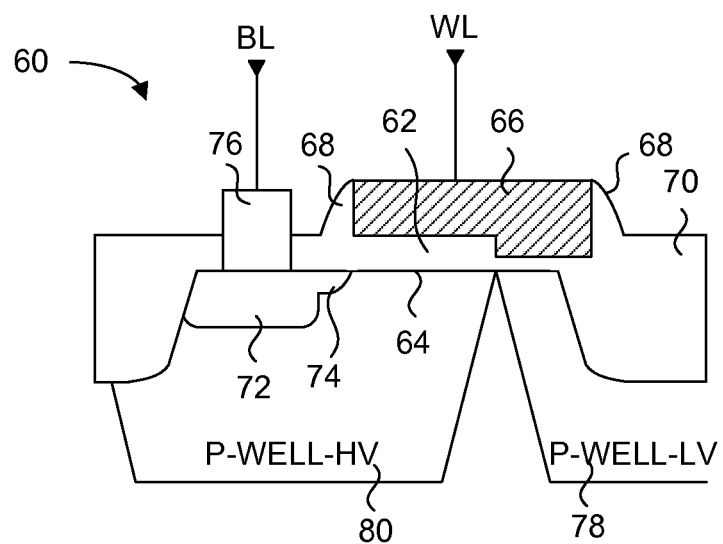
FIG. 5 is a cross-sectional view of a single transistor anti-fuse memory cell.
Figure 6:
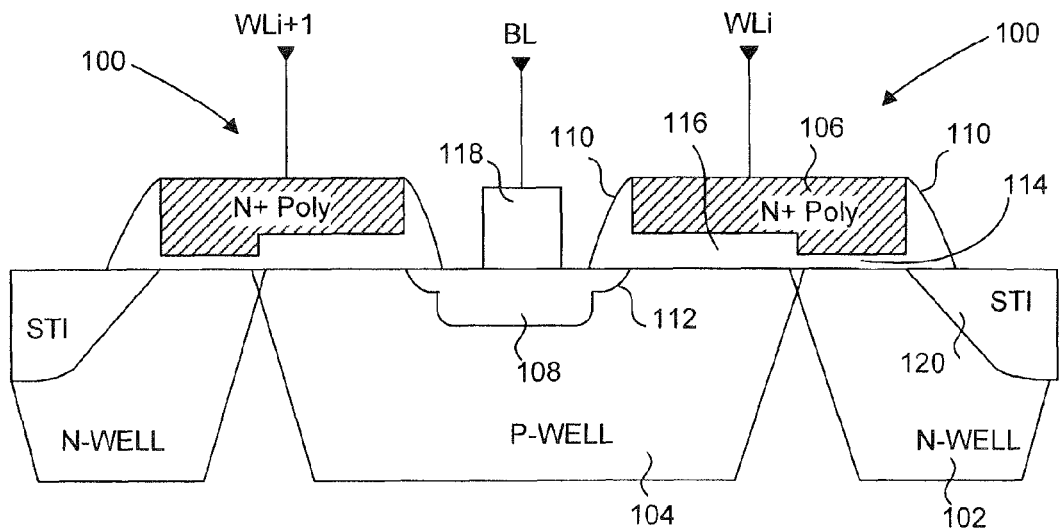
FIG. 6 is a cross sectional view of a single transistor twin-well split-channel anti-fuse memory cell, according to a present embodiment.

FIG. 6 is a cross-sectional view of two adjacent 1T N-well split-channel anti-fuse memory cells 100, according to a present embodiment. In this embodiment, each 1T twin well split-channel anti-fuse memory cell 100 is of a similar structure to the one depicted in FIG. 5. The difference between these two cells is found in the well types. The anti-fuse memory cell of FIG. 5 is formed in two P-wells for both the access transistor and the anti-device while the presently shown anti-fuse memory cell of FIG. 6 is formed in two different types of wells. Anti-fuse memory cell 100 primarily includes an N-well 102 and a P-well 104, an N+ doped polysilicon gate 106 formed over thin gate oxide 114 and thick gate oxide 116, N+ diffusion region 108. The N+ doped polysilicon gate 106 formed over the thin gate oxide 114 is an anti-fuse device, where the gate 106 and thin gate oxide 114 form a capacitive structure with the N-well 102. The N+ doped polysilicon gate 106 formed over the thick gate oxide 116 is an access device.

Therefore, anti-fuse memory cell 100 has anti-fuse device with thin gate oxide 114 formed on an N-well 102, and access transistor with thick gate oxide 116 formed on a P-well 104. Since both devices are effectively merged together, N+ doped polysilicon gate 106 straddles over both N-well 102 and P-well 104. In the present embodiments, the thin gate oxide 114 is formed at the same time that core logic transistors of the device are formed, and hence have the same thickness. Similarly, the thick gate oxide 116 is formed at the same time that input/output (I/O) transistors of the device are formed, and hence have the same thickness.

Continuing with the structure of cell 100, the N+ diffusion region 108 is formed in the P-Well 104 with LDD regions 112 extending under sidewall spacers 110 adjacent to the polysilicon gate 106. A bitline contact 118, for reading the cell, is formed on the N+ diffused region 108 in the P-well 104. STI regions 120 are formed to isolate the anti-fuse memory cell 100 from other memory cells or core circuitry. Although the present embodiment depicts an N-well anti-fuse device and a P-well access device, an alternate embodiment where the types of wells and the type of diffusion region are reversed can also be formed.

Programming of the anti-fuse device is achieved by rupturing the thin gate oxide 114 of the anti-fuse device by establishing a high enough voltage differential between the gate 106 and N-well 102. In the present embodiment, this is achieved by biasing bitline contact 118 to VSS while driving the N+ doped polysilicon gate 106 to a positive programming voltage level. Under such conditions, a conductive link is formed between the gate 106 and N-well 102. The memory cell 100 can then be read by applying a positive read voltage to gate 106, thereby turning on the access transistor while any formed conductive link in the anti-fuse device couples the read voltage to N-well 102. N-well 102 can be seen to function as another N-type diffusion region, hence access transistor couples the read voltage to the bitline contact 118. If the bitline connected to bitline contact 118 is precharged to VSS, then the bitline voltage will increase and can be sensed by suitable sensing circuitry.

During the programming of the memory cell, the thin gate oxide of the anti-fuse device acts like a capacitor between the well and the similarly doped polysilicon gate ensuring the dielectric breakdown will occur in this region and creating a conductive link between the gate and the channel. Once programmed, the bitline contact can be electrically coupled to the access transistor allowing for the reading of the programmed state of the cell. However, the anti-fuse device's capacitive structure allows for control of the dielectric breakdown by using a lower programming voltage and provides predictability of the location of the dielectric breakdown. The access device having a well of an opposite type is fabricated to be similar to other p or n type transistor devices outside of the memory array, such as thick gate oxide I/O transistors for example, in order to minimize the leakage current. An added benefit of having wells of different types is the minimization of mask alignment issues, as the breakdown will always occur at the capacitive portion regardless if the anti-fuse device or access transistor portions of the structures have been misaligned to overlap over the other well.

The structure in this embodiment is fabricated by using standard CMOS processing steps used for forming I/O transistors and core circuitry without the requirement of extra steps. This results in more reliable memory cells while maintaining substantially the same manufacturing cost. By using the twin well structure, the resulting N+ polysilicon gate-thin gate oxide-N well capacitive structure formed for the anti-fuse device promotes dielectric breakdown. Accordingly, the anti-fuse device can be more easily programmed using lower programming voltages relative to the anti-fuse device of FIG. 5 which is formed in a P-well. Direct benefits of this include faster programming speeds, and power savings. By maintaining the N-type access device in a P-well and employing thick gate oxide, current leakage is minimized.

1T memory cells, as shown in FIG. 6, are used to reduce the memory array footprint for a given memory array density. Alternately, memory array density can be increased for a fixed area. Depending on technology requirements, traditional 2T memory cells are also used. A 2T twin well anti-fuse memory cell according to another embodiment is shown in FIG. 7.

Figure 7:
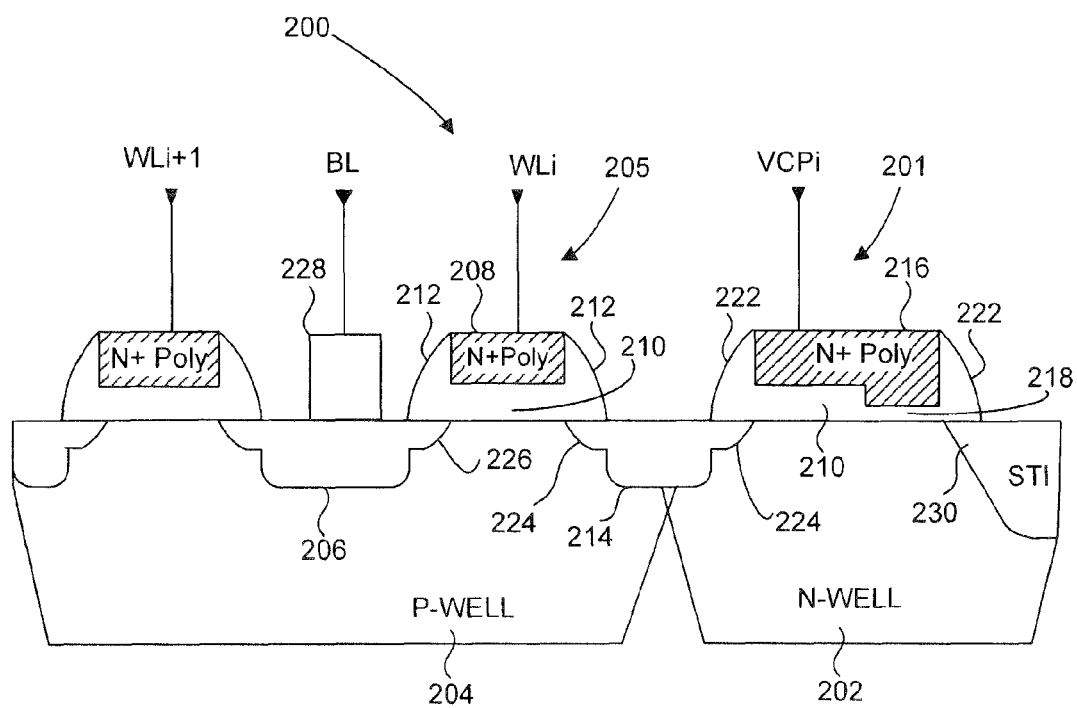
FIG. 7 is a cross sectional view of a two-transistor twin-well anti-fuse memory cell, according to a present embodiment.

FIG. 7 is a cross-sectional view of a 2T twin well anti-fuse memory cell 200. The memory cell 200 comprises of an anti-fuse device 201, and an access device 205. The anti-fuse device 201 consists of an N+ doped gate poly 216 located over both a thick gate oxide 210 and thin gate oxide 218 situated over the N-well 202. In the present embodiment, the thin gate oxide 218 is formed at the same time that core logic transistors of the device are formed, and hence have the same thickness. Similarly, the thick gate oxide 210 is formed at the same time that input/output (I/O) transistors of the device are formed, and hence have the same thickness.

Anti-fuse device 201 is substantially the same as the anti-fuse device 100 in FIG. 6, except that both the thick gate oxide 210 and thin gate oxide 218 are situated over the N-well 202. The access device 205 is located over the P-well 204 and comprises of an N+ doped polysilicon gate 208 formed over thick gate oxide 210. A first N+ diffusion region 214 is situated between the two devices 201 and 205, straddling both the N-well 202 and P-well 204. The diffusion region 214 further comprises of LDD regions 224 extending under the sidewall spacers 212 and 222 located adjacent to the two gates 208 and 216. A bitline contact 228 is formed on a second N+ diffused region 206 in the P-well 204 with LDD regions 226 extending under the sidewall spacers 212 adjacent to the polysilicon gate 208. An STI 230, is formed to the right of gate 216 opposite from the drain to isolate the memory cell 200 from other memory cells or core circuitry.

Programming of the anti-fuse device 201 is achieved by rupturing the thin gate oxide 218 of the anti-fuse device 201 in order to form a conductive link when a high enough voltage differential is applied between the gate 216 and N-well 202. This is achieved by biasing the bitline contact 228 to VSS, turning on access device 205, and applying a programming voltage to the gate 216 of anti-fuse device 201. Therefore the N-well 202 is biased to VSS while gate 216 is driven to the programming voltage level. The memory cell 200 can then be read by applying a first read voltage to the gate 208 of access device 205, and applying a second read voltage to the gate 216 of anti-fuse device 201. If a conductive link is formed in the anti-fuse device 201, then the second read voltage is coupled to the N-well 202, and to diffusion region 214. Then access device 205, being turned on by the application of the first read voltage, couples the diffusion region 214 to bitline contact 228. As for the embodiment of FIG. 6, the bitline connected to bitline contact 228 can be sensed as its voltage level increases, in order to read the programmed state of the memory cell 200.

The previously described embodiment of FIG. 7 shows a 2T twin well anti-fuse memory cell which uses the variable thickness gate oxide device as an anti-fuse device. According to the following alternate embodiment, an anti-fuse device having a uniform thin gate oxide can be used instead. Such an alternate embodiment is shown in FIG. 8.

Figure 4:
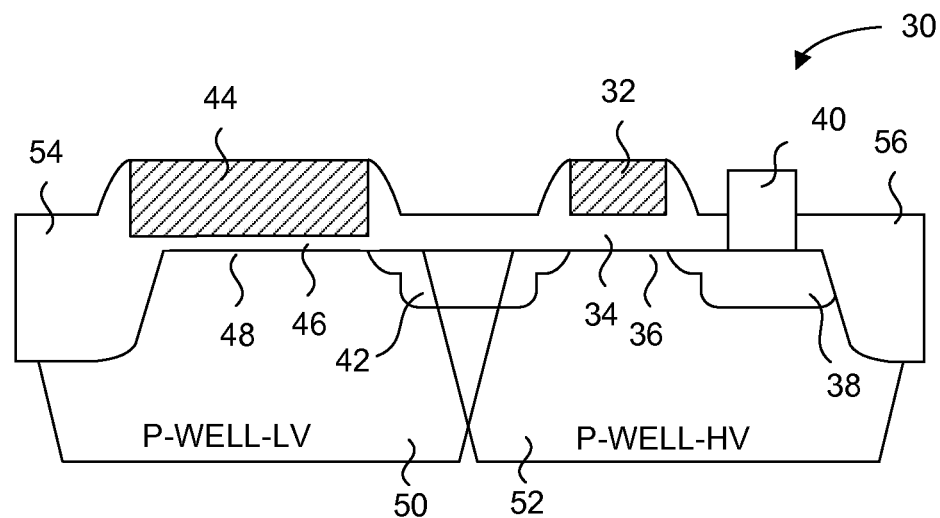
FIG. 4 is a cross-sectional view of a two-transistor anti-fuse memory cell.
Figure 8:
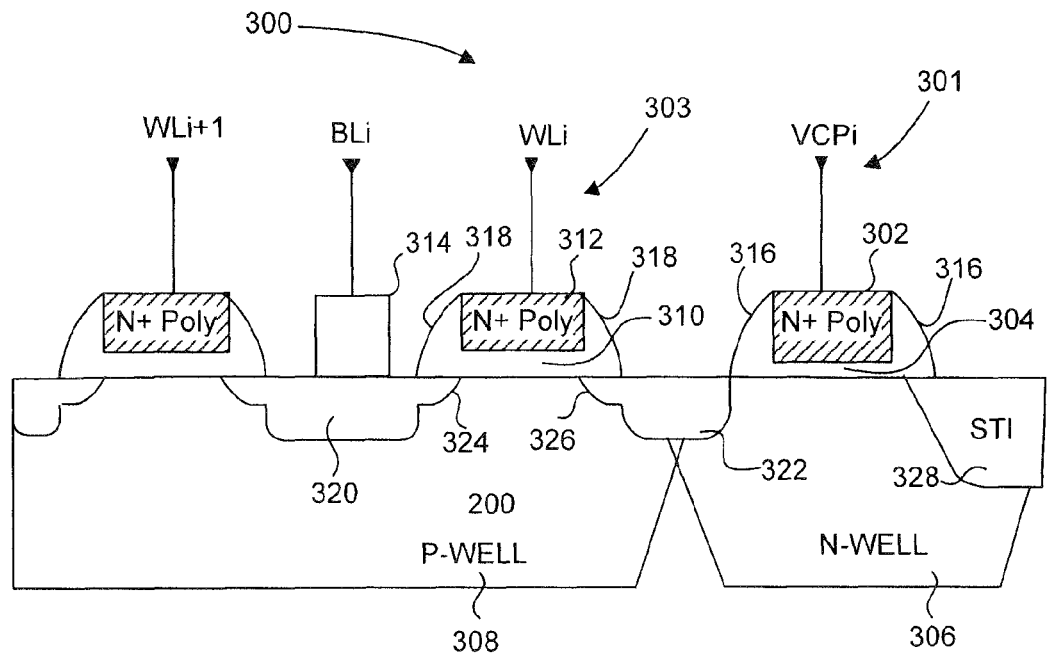
FIG. 8 is a cross sectional view of a two-transistor twin-well anti-fuse memory cell without LDD region, according to a present embodiment.

FIG. 8 is a cross-sectional view of a 2T twin well anti-fuse memory cell 300, according to an alternate embodiment. The 2T twin well anti-fuse memory cell 300 of FIG. 8 is similar to the cell shown FIG. 4, where FIG. 4 shows a 2T anti-fuse memory cell having similar type wells profiled as of HV and LV types. The memory cell 300 comprises of an anti-fuse device 301 and an access transistor 303 connected to a bitline contact 314. The anti-fuse device 301 is formed on the N-well 306 using a thin gate oxide 304 underneath the entire length dimension of an N+ doped polysilicon gate 302. The N+ doped polysilicon gate 302 forms a capacitive structure with the N-well 306. The access transistor 303 is formed on the P-well 308 and includes a thick gate oxide 310 underneath an N+ doped polysilicon gate 312. A first N+ diffusion region 322 straddles the N-well 306 and P-Well 308 between the two gates 312 and 302, and a second diffusion region 320 is located in the P-well 308 on the left side of gate 312. To provide isolation from other memory cells or core circuitry, an STI region 328, is formed to the right of the gate 302. A bitline contact 314, for reading the memory cell 300, is located on the second diffusion region 320.

The diffusion regions 320 and 322 have LDD regions 324 and 326 extending under the sidewall spacers 318 adjacent to gate 312. However, since no LDD region is formed under the sidewall spacer 316 of the gate 302, the sidewall spacer 316 can be formed to be as thick as possible, and can be thicker than sidewall spacer 318. This means that the right side edge of diffusion region 322 would be spaced further away from the left side edge of polysilicon gate 302, than the spacing between the right side edge of polysilicon gate 312 and the left side edge of diffusion region 322. Without this LDD region, a conductive link is formed only between the gate 302 and the N-well 306 during programming. Experiments have shown that the presence of an LDD in the anti-fuse device 301 may cause the conductive link to form between the gate 302 and the LDD region. Such a conductive link can exhibit electrical characteristics which differ from a conductive link formed between the gate 302 and N-well 306, thereby changing the expected behaviour of the anti-fuse device 301.

The previously shown embodiments of the twin well anti-fuse memory cell include an access device and an anti-fuse device in series with a bitline contact. According to yet another alternate embodiment, the access device can be omitted from the memory cell. In this alternate embodiment, the memory cell includes just an anti-fuse device consisting of an N+ doped polysilicon gate and uniform thin gate oxide over an N-well. An embodiment of such a memory cell is shown in FIG. 9.

Figure 9:
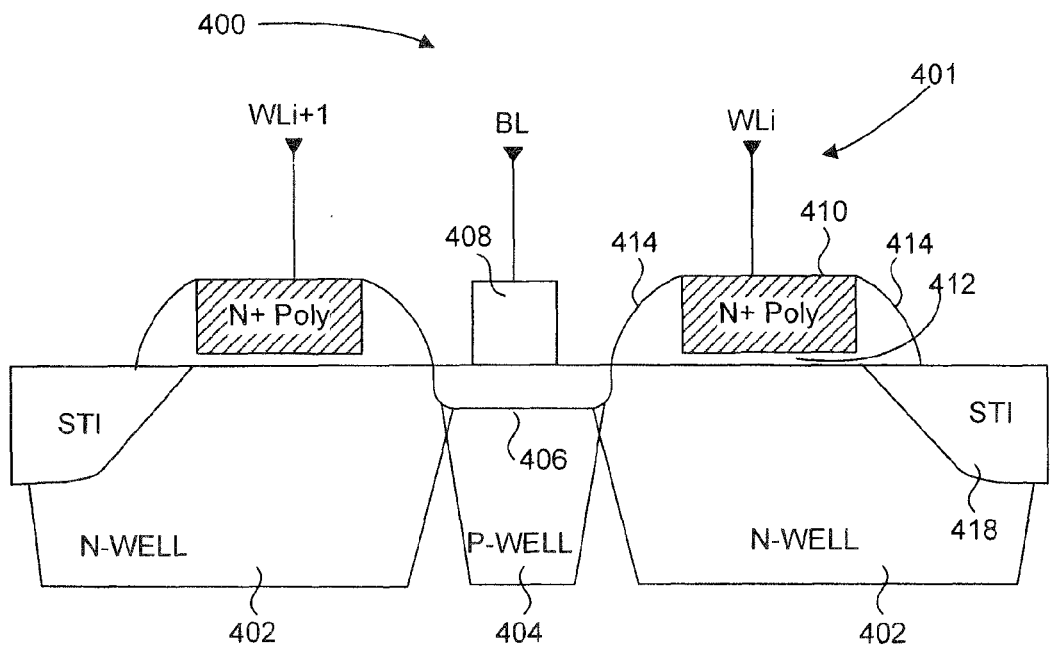
FIG. 9 is a cross sectional view of the single transistor anti-fuse memory cell without LDD region, according to a present embodiment.

FIG. 9 is a cross-sectional view of a 1T anti-fuse memory cell 400 formed over an N-well without an LDD region at the drain. This embodiment shows an anti-fuse device 401 over an N-well 402 with a thin gate oxide 412, similar in thickness to the gate oxide of the core circuitry transistors, underneath an N+ doped polysilicon gate 410. A bitline contact 408, for reading the memory cell, is located over the N+ diffusion region 406 located in the P-well 404. Since this embodiment does not require an LDD region, sidewall spacers 414 are formed adjacent to the gate 410 and can be made thicker than typical sidewall spacers, such as the sidewall spacers 318 formed for the access device 303 of FIG. 8. To isolate the memory cell 400 from other memory cells or core circuitry, an STI region 418 is formed beside the gate 410 opposite from the drain.

In the present embodiments, the anti-fuse memory cells described above are fabricated using the same CMOS processing steps used for fabricating core and I/O transistor circuitry of a device. In particular, the processing steps for forming at least the thick gate oxides, thin gate oxides, N-wells, P-wells and diffusion regions of the twin well anti-fuse memory cell embodiments, are the same ones used for forming the I/O and core transistor circuits peripheral to the memory array. All that is required is an adaptation of the masking levels required to form the I/O and core transistor structures to include formation of corresponding structures for the anti-fuse memory cells of the memory array. Not having to require extra processing steps for forming memory array structures relative to core and I/O transistor structures provides the benefit of lower process complexity and lower manufacturing costs. Additional cost savings are realized due to the scalability of CMOS processes enabling portability to lower process nodes. This means that the mask sets configured for one process node only needs to be scaled for a lower process node, rather than redesigned. FIG. 10-13 show the main processing steps required to create the associated structures for each of the previously shown anti-fuse memory cell embodiments. Not all process steps will be shown, as persons skilled in the art would understand the order and application of the process steps intentionally omitted from the figures.

FIG. 10A to 10G depict the masking and processing steps of fabricating the 1T N-well split-channel anti-fuse memory cell 100 shown in FIG. 6. The same reference numbers shown in FIG. 6 are used to annotate the same features of FIG. 10A to 10G.

FIG. 10A shows the previously formed STI regions 120 that will be used for isolation between circuitry. In FIG. 10A, a P-well mask 550 is patterned on the wafer followed by the implant of p-type dopants. The mask 550 blocks the p-type dopants from implantation into the substrate. It is noted that I/O transistor P-wells or core transistor P-wells are formed at the same time.

FIG. 10B shows the resulting P-well 104, after drive-in or annealing. P-well 104 can be the same as those used for I/O transistors. FIG. 10B shows the first step used to form the N-well, which includes patterning the wafer with an N-well mask 552 followed by the implant of the n-type dopants into the exposed substrate not covered by N-well mask 552. N-well mask 552 prevents the n-type dopants from entering P-well 104. It is noted that I/O transistor N-wells or core transistor N-wells are formed at the same time.

FIG. 10C shows the completed formation of the wells 102 and 104. In FIG. 10C, an intermediate gate oxide film 554 is deposited over the substrate, followed by patterning with an intermediate gate oxide mask 556 to expose areas where thin gate oxide is to be formed. The oxide film 554 covered by the gate oxide mask 556 are areas where thick gate oxide is to be formed. It is noted that intermediate gate oxide mask 556 is positioned such that the thick gate oxide areas are formed within P-well 104. The left gate oxide mask 556 segment has a left edge which is substantially aligned with the interface of P-well 104 and N-well 102. Similarly, the right gate oxide mask 556 segment has a right edge which is substantially aligned with the interface of P-well 104 and the other N-well 102.

The exposed areas not covered by gate oxide mask 556 are etched back to the substrate. While not shown in FIG. 10C, gate oxide mask 556 is subsequently removed and a thinner second gate oxide film is deposited over the exposed substrate and remaining intermediate gate oxide film 554. This thinner second gate oxide film forms the final thin gate oxide (shown as 558 in FIG. 10D), while the combined oxide film 554 and thinner second gate oxide film forms the final thick gate oxide (shown as 555 in FIG. 10D). Alternately, instead of depositing the second gate oxide film, a thin gate oxide is grown on the exposed substrate to form the final thin gate oxide. This growth also occurs underneath the remaining intermediate gate oxide film 554 to increase its final thickness. Those skilled in the art should understand that the thickness of the thin oxide grown underneath the intermediate gate oxide film 554 will not be as thick as the thin oxide grown on the exposed substrate.

FIG. 10D depicts the polysilicon gate formation stage for the anti-fuse memory cell after the final thick gate oxide 555 and final thin gate oxide 558 have been formed in FIG. 10C. First is a deposition of a polysilicon layer 560 over the thick gate oxide 555 and thin gate oxide 558, followed by patterning using gate patterning mask 562. The wafer is then subjected to an etch back step to remove exposed polysilicon layer 560 not covered by gate patterning mask 562, and any underlying thin or thick gate oxide material.

The source/drain region is formed by a two step process; LDD implant and N+ implant. FIG. 10E shows the first step of the source/drain formation, in which an LDD mask 564 is applied to expose areas in the substrate where an LDD is to be formed, while blocking the other structures where no LDD is to be formed. After exposing the selected areas via the LDD mask 564, a low dose n-type implant step follows to create the LDD region in P-well 104.

FIG. 10F shows sidewall spacers 110 which have been formed using well known techniques in the art. The low dose regions 112 implanted in FIG. 10E are also shown in FIG. 10F. The second step of the source/drain formation is now shown, which is an N+ implant into the low dose regions 112. Upon completion of this implant process, an annealing process is required to activate the implanted dopants and to heal any implant damage. The resulting structure is shown in FIG. 10G.

A bitline contact 118, shown in FIG. 10G, is formed on the N+ diffused region 108 in the P-well 104 using known backend interconnect processing steps. A person skilled in the art will be familiar with the backend processing steps for the interconnection formation.

FIG. 11A-11G depicts the steps for the formation of the 2T twin well anti-fuse memory cell 200 shown in FIG. 7. The process steps used in the formation of this embodiment are substantially the same as those described for the embodiment described in FIG. 10A-10G. The main difference between the two embodiments depends on the differences in the photomasks used during the fabrication to create the structures. The process flow to form the 2T twin well anti-fuse memory cell is further explained.

Figure 11A:
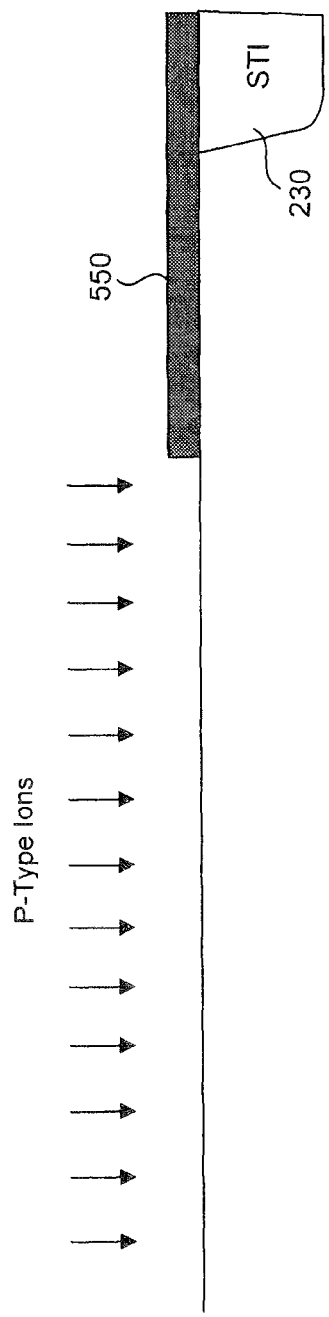

FIG. 11A shows the formed STI regions 230 that will be used for isolation between circuitry. The steps for forming the P-well are shown. A P-well mask 550 is patterned on the wafer followed by the implant of p-type dopants.

Figure 11B:
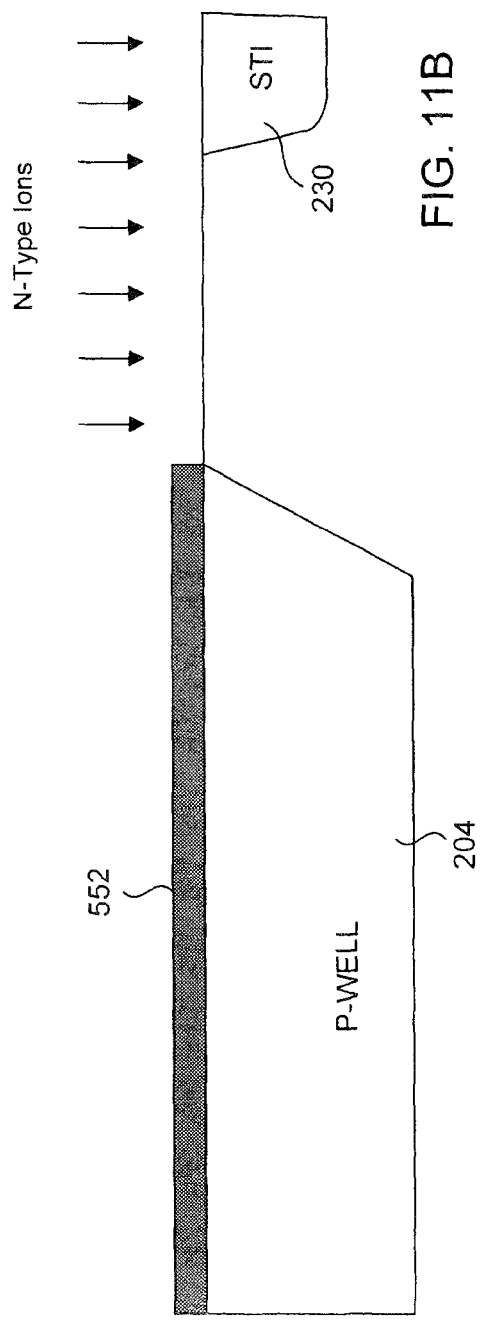

FIG. 11B shows the formed P-well 204, and the initial step used to form the N-well. This includes patterning the wafer with an N-well mask 552 to expose only the area of the substrate in which n-type dopants are to be implanted.

Upon completion of the two implants in FIG. 11A and 11B, the resulting N-well 202 and P-well 204 are shown in FIG. 11C. In FIG. 11C, an intermediate gate oxide film 554 is deposited over the substrate and patterned with an intermediate gate oxide mask 556, and then etched. This step defines the areas for which thick 210 and thin 218 gate oxide will be used, and the thin and thick gate oxide formation techniques previously described for FIG. 10C are applicable to the presently described process.

FIG. 11D depicts the gate formation stage after the final thin and thick gate oxides have been formed. A polysilicon layer 560 is deposited over the final thin and thick gate oxides, and a gate patterning mask 562 is applied to define the polysilicon gates of the anti-fuse memory cells. Finally, an etching step is executed to remove all polysilicon and gate oxide that is not covered by gate patterning mask 562.

The source/drain region is formed by a two step process; LDD implant and N+ implant. FIG. 11E shows the resulting gate oxide and polysilicon structures after the final etching step described for FIG. 11D. In FIG. 11E, the exposed areas not covered by mask 564 are subjected to a low dose n-type implant to create the LDD region.

Figure 11G:
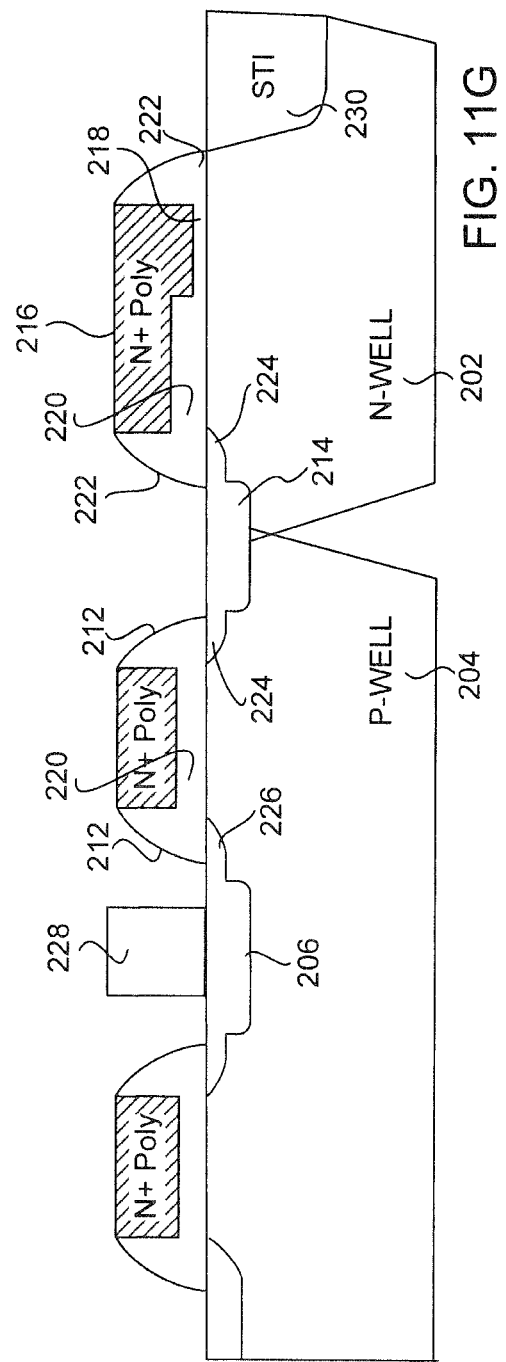

The low dose regions implanted in FIG. 11E are shown in FIG. 11F as regions 224 and 226. The second step of the source/drain formation is shown in FIG. 11F, which begins with the formation of the sidewall spacers 212 and 222 followed by the N+ implant into regions 224 and 226. Upon completion of the implant process, an annealing process is required to activate the implanted dopants and to heal any implant damage. The resulting structure is shown in FIG. 11G. A bitline contact 228, shown in FIG. 11G, is formed on the channel N+ diffused region 206 in the P-well using known backend interconnect processing steps. A person skilled in the art will be familiar with the backend processing steps for the interconnection formation.

FIG. 12A-12G depict the processing steps of fabricating the 2T twin well anti-fuse memory cell structure formed over an N-well without an LDD region at the drain end of the channel shown in FIG. 8. The process flow to fabricate the structure shown in FIG. 8 is the same as the standard CMOS process flows used in the fabrication of the I/O transistors and the core transistors. The process flow shown in FIG. 12 follows the same process flow as described for FIG. 11, except that the gate oxides are of uniform thickness and the LDD regions closest to the anti-fuse device are not formed. These structural differences are addressed in the process by differences in the photomasking steps. A person skilled in the art will be familiar with the photomasking process and will be able to understand the differences between the process steps shown in FIGS. 11 and 12.

Figure 12A:
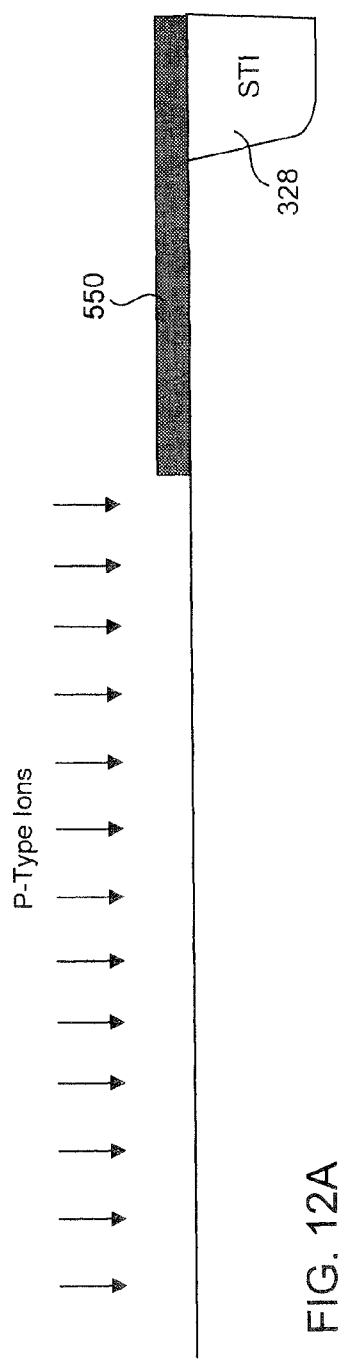
Figure 12B:
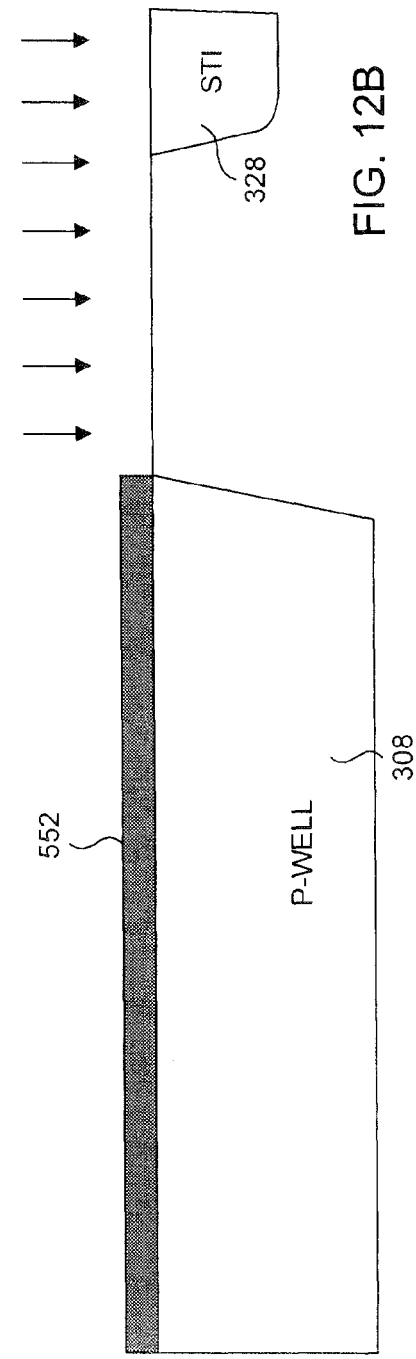

FIG. 12A shows the formed STI regions 328, and a P-well mask 550 patterned on the wafer. The exposed areas not covered by P-well mask 550 are subjected to implantation of p-type dopants. The resulting P-well is shown in FIG. 12B. FIG. 12B shows patterning of the wafer with an N-well mask 552 followed by the implant of n-type dopants into the areas not covered by well mask 552.

Upon completion of the two implants in FIG. 12A and 12B, the resulting wells 308 and 306 are shown in FIG. 12C. Subsequently an intermediate gate oxide film 554 is deposited over the substrate, and an intermediate gate oxide mask 556 is applied. The exposed areas not covered by gate oxide mask 556 are etched back to the substrate, and a thinner gate oxide film is deposited or a thin gate oxide is grown on the exposed substrate.

FIG. 12D depicts the gate formation stage after deposition or growth of the thinner second gate oxide, thereby forming thick gate oxide 555 and thin gate oxide 558. FIG. 12D shows deposition of a polysilicon layer 560 over the thick gate oxide 555 and thin 558 gate oxide, followed by application of a gate patterning mask 562. It is noted that the rightmost gate patterning mask segment 562 is used to form the anti-fuse device in N-well 306, which will have a uniform thin gate oxide 558. The wafer is subjected to an etching step to remove any exposed polysilicon 560 and underlying gate oxide 558.

The source/drain region is formed by a two step process; LDD implant and N+ implant. FIG. 12E shows the first step of the source/drain formation, the LDD masking 564 and the application of a low dose n-type implant to create the LDD region. It is noted that the LDD masking 564 for the anti-fuse device consisting of polysilicon 560 and thin gate oxide 558 covers both sides of the anti-fuse device structure. Therefore the subsequent LDD implant is positioned at a predetermined distance from the edge of the anti-fuse device structure.

The low dose regions implanted in FIG. 12E are shown in FIG. 12F. The second step of the source/drain formation is shown in FIG. 12F. The steps include the formation of the sidewall spacers 316 and 318 followed by the N+ implant. In an embodiment, the formation of the sidewall spacer 316 can include a non-standard sidewall spacer formation step to provide a thicker than typical sidewall spacer. It is noted that the sidewall spacers 316 for the anti-fuse device in the N-well 306 do not have an LDD region formed underneath. Upon completion of the implant process, an annealing process is required to activate the implanted dopants and to heal any implant damage. The resulting structure is shown in FIG. 12G.

Figure 12G:
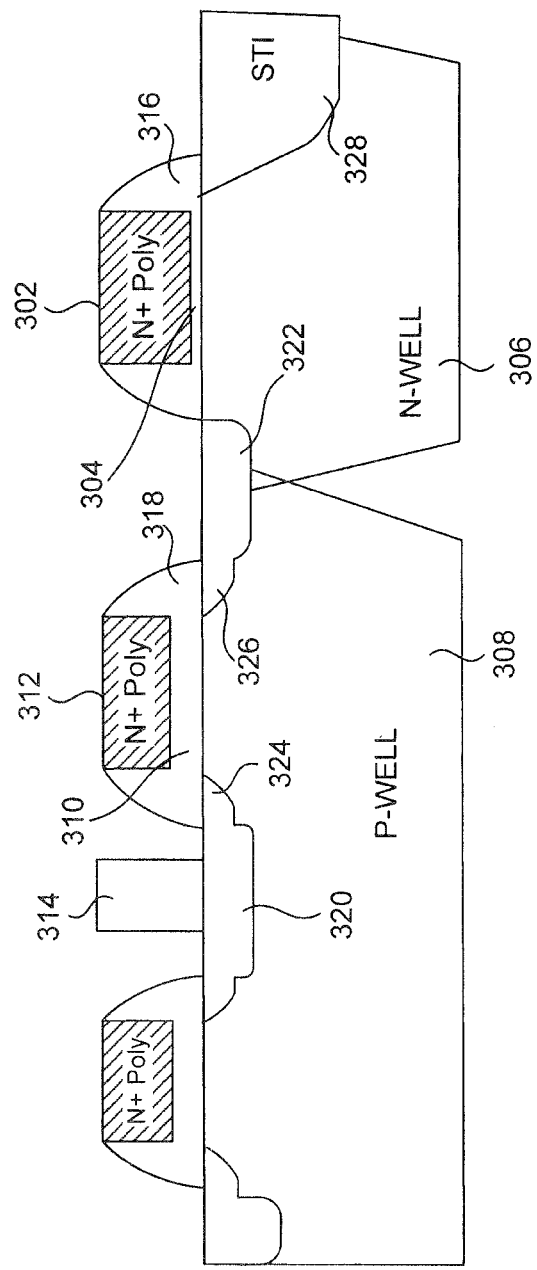

A bitline contact 314, shown in FIG. 12G, is formed over the channel in the P-well using known backend interconnect processing steps. A person skilled in the art will be familiar with the backend processing steps for the interconnection formation.

FIG. 13A to 13E depicts the processing steps of fabricating the 1T anti-fuse memory cell shown in FIG. 9. The process flows to fabricate the structures shown in FIG. 9 are the same as the standard CMOS process flows used in the fabrication of the I/O and core circuitry. The process flow shown in FIG. 13A to 13E follow substantially the same process flow as explained in FIG. 10-12. It should be noted the process flow in FIG. 13A to 13E does not contain images depicting the intermediate gate oxide deposition and etch, as well as the LDD implant, as these steps are not required for the formation of the structure and would be masked out during the process steps used for the formation of the I/O and core circuitry.

FIG. 13A shows the formed STI regions 418 that will be used for isolation between circuitry. A P-well mask 550 is patterned on the wafer followed by the implant of p-type dopants, for formation of the P-well. FIG. 13B shows the resulting P-well 404 after application of an N-well mask 552. The P-well 404 is protected from the implantation of n-type dopants, which are used for forming N-wells on either side of P-well 404.

Upon completion of the two implants in FIG. 13A and 13B, the resulting wells 402 and 404 are shown in FIG. 13C. Since thick gate oxide is not required, the structure in FIG. 9 would have the intermediate oxide deposited and then etched back during the intermediate oxide etch step. Subsequently a thin gate oxide film 558 is deposited or grown on the substrate, followed by the deposition of a polysilicon layer 560. A gate patterning mask 562 is applied for defining the polysilicon gate and thin gate oxide stack of the anti-fuse device. An etching step is then conducted to remove all material not covered by mask 562.

In the standard CMOS process the source/drain region is typically formed by a two step process; LDD implant and N+ implant. The first step, LDD implant, is not shown in FIG. 13A to 13E since the structure in FIG. 9 does not require LDD regions. By example, the process step shown by FIG. 10E depicts the process step for the LDD implant. In the present process, prior to FIG. 13D, a photoresist mask would cover the structures shown in FIG. 13D to block the device from receiving LDD implant doping.

Figure 13E:
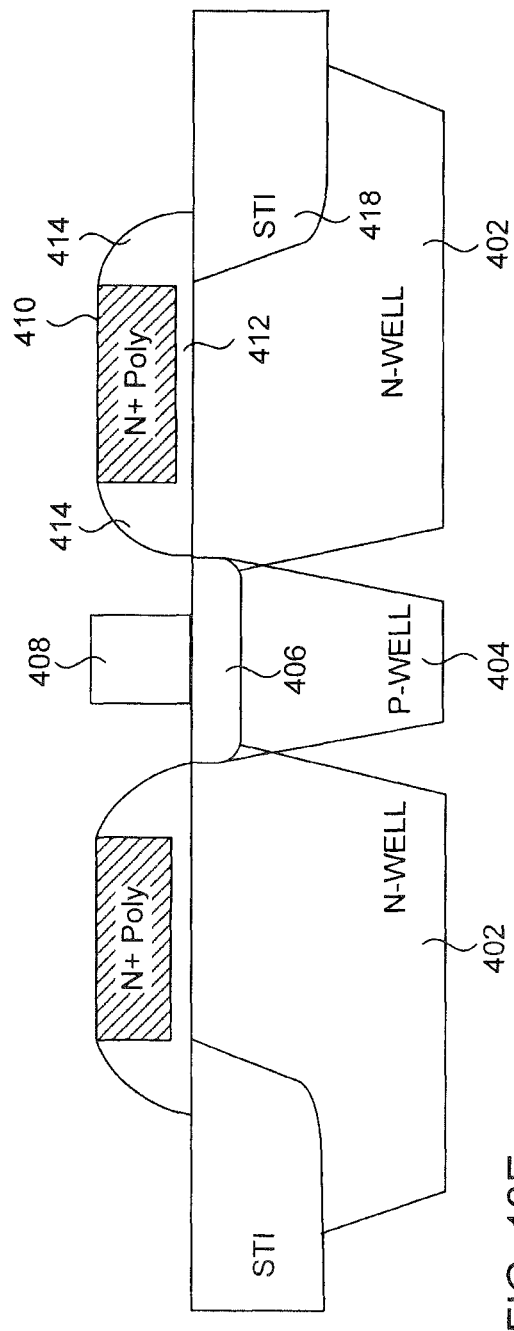

The second step of the source/drain formation, N+ implant, is shown in FIG. 13D. The steps include the formation of the sidewall spacers 414 followed by the N+ implant. In an embodiment, the formation of the sidewall spacer 414 can include a non-standard sidewall spacer formation step to provide a thicker than typical sidewall spacer. Upon completion of the implant process, an annealing process is required to activate the implanted dopants and to heal any implant damage. The resulting structure is shown in FIG. 13E.

A bitline contact 408, shown in FIG. 13E, is formed on the N+ diffused region 406 in the P-well using known backend interconnect processing steps. A person skilled in the art will be familiar with the backend processing steps for the interconnection formation.

Figure 14:
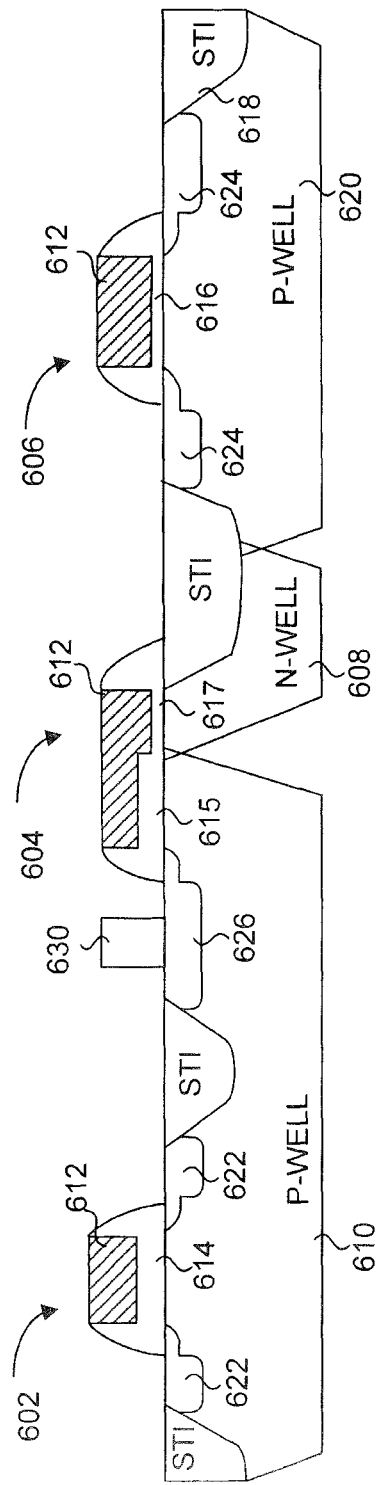

As previously mentioned, the steps for forming the different anti-fuse memory cells are the same CMOS process steps used to form corresponding structures of I/O and/or core transistors of the device. FIG. 14. shows transistor structures for a twin well anti-fuse memory cell transistor, an I/O transistor and a core logic transistor that would be fabricated on a semiconductor device. Each of the transistor devices is separated by STI 618 to show the isolation that would exist between the three types of transistors within a semiconductor device.

The I/O transistor 602 is shown to have an N+ poly gate 612 over thick gate oxide 614 formed over a P-well 610, with diffusion regions 622 The twin well anti-fuse memory cell 604 is shown to have an N+ doped polysilicon gate 612 over both thick gate oxide 615 and thin gate oxide 617, where the anti-fuse device with thin gate oxide 617 is formed on the N-well 608, the access device with the thick gate oxide 615 is formed on the P-well 610, and includes a bitline contact 630 on a diffusion region 626. It is noted that the thick gate oxide 614 and 615 are formed at the same time, and thus have substantially the same thickness. Furthermore, the I/O transistor 602 being an N-type device, can be formed in the same P-well 610, or separate identical P-well, that the anti-fuse memory cell 604 is formed in. In the presently shown embodiment, P-well 610 can be a high voltage well, having a profile or characteristics optimized for higher voltage I/O operation. Hence the high voltage P-wells for the access device of the anti-fuse memory cell 604 and the I/O transistor 602 are formed at the same time.

The core transistor 606 is shown to have an N+ polysilicon gate 612 over a thin gate oxide 616 formed over a P-well 620 and diffusion region 624 It is noted that the thin gate oxide 616 and 617 are formed at the same time, and thus have substantially the same thickness. P-well 620 for the core transistor 606 can have a low voltage profile, in other words, characteristics optimized for low voltage and high speed operation. N-well 608 can also have a low voltage profile, and could be the same type of N-well used for P-type core transistors. In an alternate embodiment, the P-wells used for the access device of the anti-fuse memory cell 604 and the I/O transistor 602 can be the same type, but having different profiles. For example, the I/O transistor 602 can be formed in a high voltage P-well while the access device of the anti-fuse memory cell 604 can be formed in a low voltage P-well identical to P-well 610 of the core transistor 606.

The previously presented example embodiments show single transistor and two transistor anti-fuse memory cells having the anti-fuse device formed in an N-well and the access device, the I/O and core circuitry formed in P-wells. Alternately, the anti-fuse device can be formed in a P-well while the access device, I/O and core circuitry are formed in N-wells. Further variations are possible by the use of low voltage (LV) and high voltage (HV) doping of the P-wells and the N-wells.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory device comprising:
a first well of a first type;
a second well of a second type formed adjacent to the first well;
an anti-fuse device formed over the second well with a first polysilicon gate doped to be the second type;
an isolation region in the second well and adjacent to the first polysilicon gate;
and,
an access device formed over the first well with a second polysilicon gate for electrically coupling the anti-fuse device to a bitline contact; and
a diffusion region in the first well and electrically connected to the bitline contact.

2. The memory device of claim 1, wherein the anti-fuse device has a first gate oxide and the access device has a second gate oxide, the second gate oxide being thicker than the first gate oxide.

3. The memory device of claim 2, further including a core transistor device formed in a third well identical to the second well.

4. The memory device of claim 3, wherein the core transistor has a gate oxide substantially identical in thickness to the first gate oxide.

5. The memory device of claim 2, further including an input/output transistor device formed in a third well identical to the first well.

6. The memory device of claim 5, wherein the input/output transistor device has a gate oxide substantially identical in thickness to the second gate oxide.

7. The memory device of claim 2, wherein the anti-fuse device and the access device are formed together as a split-channel anti-fuse memory cell having a variable thickness gate oxide.

8. The memory device of claim 4, wherein the access device is electrically coupled to the anti-fuse device through a diffusion region.

9. The memory device of claim 8, wherein the diffusion region includes a lightly doped drain (LDD) region extending towards the first polysilicon gate and the second polysilicon gate.

10. The memory device of claim 8, wherein the anti-fuse device includes a split-channel anti-fuse memory cell having a variable thickness gate oxide formed on the second well.

11. The memory device of claim 10, wherein the split-channel anti-fuse memory cell includes an access device portion and an anti-fuse device portion.

12. The memory device of claim 11, wherein the access device portion has a third gate oxide, the third gate oxide being thicker than the first gate oxide.

13. The memory device of claim 12, wherein the second gate oxide and the third gate oxide are substantially the same thickness.

14. The memory device of claim 8, wherein the first gate oxide of the anti-fuse device has a uniform thickness underneath an entire length of the first polysilicon gate.

15. The memory device of claim 14, wherein the diffusion region includes a lightly doped drain (LDD) region extending towards the second polysilicon gate.

16. The memory device of claim 15, wherein the diffusion region omits an LDD region extending towards the first polysilicon gate.

17. The memory device of claim 16, wherein the anti-fuse device includes a first sidewall spacer formed adjacent to the first polysilicon gate, and the access device includes a second sidewall spacer formed adjacent to the second polysilicon gate, the first sidewall spacer being thicker than the second sidewall spacer.

18. A memory array comprising,
   anti-fuse devices formed over wells of a first type;
   isolation regions in the wells of the first type adjacent to gate oxides of the anti-fuse devices for isolating the anti-fuse devices from other devices;
   access devices formed over wells of a second type opposite to the first type for electrically coupling the anti-fuse devices to corresponding bitlines, wherein the wells of a second type are formed adjacent to the wells of the first type; and,
   diffusion regions in the wells of the second type and electrically connected to the bitlines.

19. The memory array of claim 18, wherein the anti-fuse devices includes polysilicon gates doped to be the first type.

20. The memory array of claim 18, wherein each of the anti-fuse devices and the access devices are formed as a single transistor anti-fuse memory cell having a variable thickness gate oxide, where the anti-fuse device has a first gate oxide thickness and the access device has a second gate oxide thickness greater than the first gate oxide thickness.

* * * * *